US011257742B2

(12) United States Patent
Liu et al.

(10) Patent No.: US 11,257,742 B2
(45) Date of Patent: Feb. 22, 2022

(54) WIRING STRUCTURE AND METHOD FOR MANUFACTURING THE SAME

(71) Applicant: Advanced Semiconductor Engineering, Inc., Kaohsiung (TW)

(72) Inventors: Syu-Tang Liu, Kaohsiung (TW); Tsung-Tang Tsai, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/919,967

(22) Filed: Jul. 2, 2020

(65) Prior Publication Data
US 2022/0005756 A1 Jan. 6, 2022

(51) Int. Cl.
*H05K 1/02* (2006.01)
*H05K 1/11* (2006.01)
*H05K 1/18* (2006.01)
*H01L 23/498* (2006.01)
*H01L 21/48* (2006.01)
*H05K 1/14* (2006.01)

(52) U.S. Cl.
CPC ...... *H01L 23/49822* (2013.01); *H01L 21/486* (2013.01); *H01L 21/4857* (2013.01); *H01L 23/49827* (2013.01); *H01L 23/49833* (2013.01); *H05K 1/111* (2013.01); *H05K 1/14* (2013.01); *H05K 1/0284* (2013.01); *H05K 1/0298* (2013.01); *H05K 1/181* (2013.01)

(58) Field of Classification Search
CPC ............. H01L 23/49822; H01L 21/486; H01L 23/49833; H01L 23/49827; H01L 21/4857
See application file for complete search history.

(56) References Cited

U.S. PATENT DOCUMENTS

| 5,892,657 | A | * | 4/1999 | Inoue | H01L 25/0657 361/704 |
|---|---|---|---|---|---|
| 2013/0014982 | A1 | * | 1/2013 | Segawa | H05K 1/141 174/263 |
| 2016/0020163 | A1 | * | 1/2016 | Shimizu | H01L 23/49822 361/768 |
| 2016/0105960 | A1 | * | 4/2016 | Sakamoto | H05K 3/4694 361/720 |
| 2016/0343645 | A1 | * | 11/2016 | Pan | H01L 23/16 |
| 2019/0380212 | A1 | * | 12/2019 | Chien | H05K 3/4038 |

FOREIGN PATENT DOCUMENTS

JP 2012-099610 A 5/2012

* cited by examiner

*Primary Examiner* — Ishwarbhai B Patel
(74) *Attorney, Agent, or Firm* — Foley & Lardner LLP

(57) ABSTRACT

A wiring structure includes a conductive structure and at least one conductive through via. The conductive structure includes a plurality of dielectric layers, a plurality of circuit layers in contact with the dielectric layers, and a plurality of dam portions in contact with the dielectric layers. The dam portions are stacked on and contact one another. The conductive through via extends through the dam portions.

20 Claims, 43 Drawing Sheets

WIRING STRUCTURE AND METHOD FOR MANUFACTURING THE SAME

BACKGROUND

1. Field of the Disclosure

The present disclosure relates to a wiring structure and a manufacturing method, and to a wiring structure including at least one conductive through via, and a method for manufacturing the same.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a thickness and a warpage of the semiconductor substrate may correspondingly increase, and a yield of the semiconductor substrate may decrease.

SUMMARY

In some embodiments, a wiring structure includes a conductive structure and at least one conductive through via. The conductive structure includes a plurality of dielectric layers, a plurality of circuit layers in contact with the dielectric layers, and a plurality of dam portions in contact with the dielectric layers. The dam portions are stacked on and contact one another. The conductive through via extends through the dam portions.

In some embodiments, a wiring structure includes a lower conductive structure, an upper conductive structure and at least one conductive through via. The lower conductive structure includes at least one dielectric layer and at least one circuit layer in contact with the dielectric layer. The upper conductive structure is disposed on the lower conductive structure. The upper conductive structure includes a plurality of dielectric layers, a plurality of circuit layers in contact with the dielectric layers, and a plurality of dam portions in contact with the dielectric layers. The dam portions are stacked on and contact one another. The conductive through via extends through the dam portions and the upper conductive structure, and terminates on the circuit layer of the lower conductive structure.

In some embodiments, a method for manufacturing a wiring structure includes: (a) providing a lower conductive structure including at least one dielectric layer and at least one circuit layer in contact with the dielectric layer; (b) providing an upper conductive structure including a plurality of dielectric layers, a plurality of circuit layers in contact with the dielectric layers, and a plurality of dam portions in contact with the dielectric layers, wherein the dam portions are stacked on and contact one another; (c) attaching the upper conductive structure to the lower conductive structure; and (d) forming at least one conductive through via to extend through the dam portions of the upper conductive structure and contact the circuit layer of the lower conductive structure.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
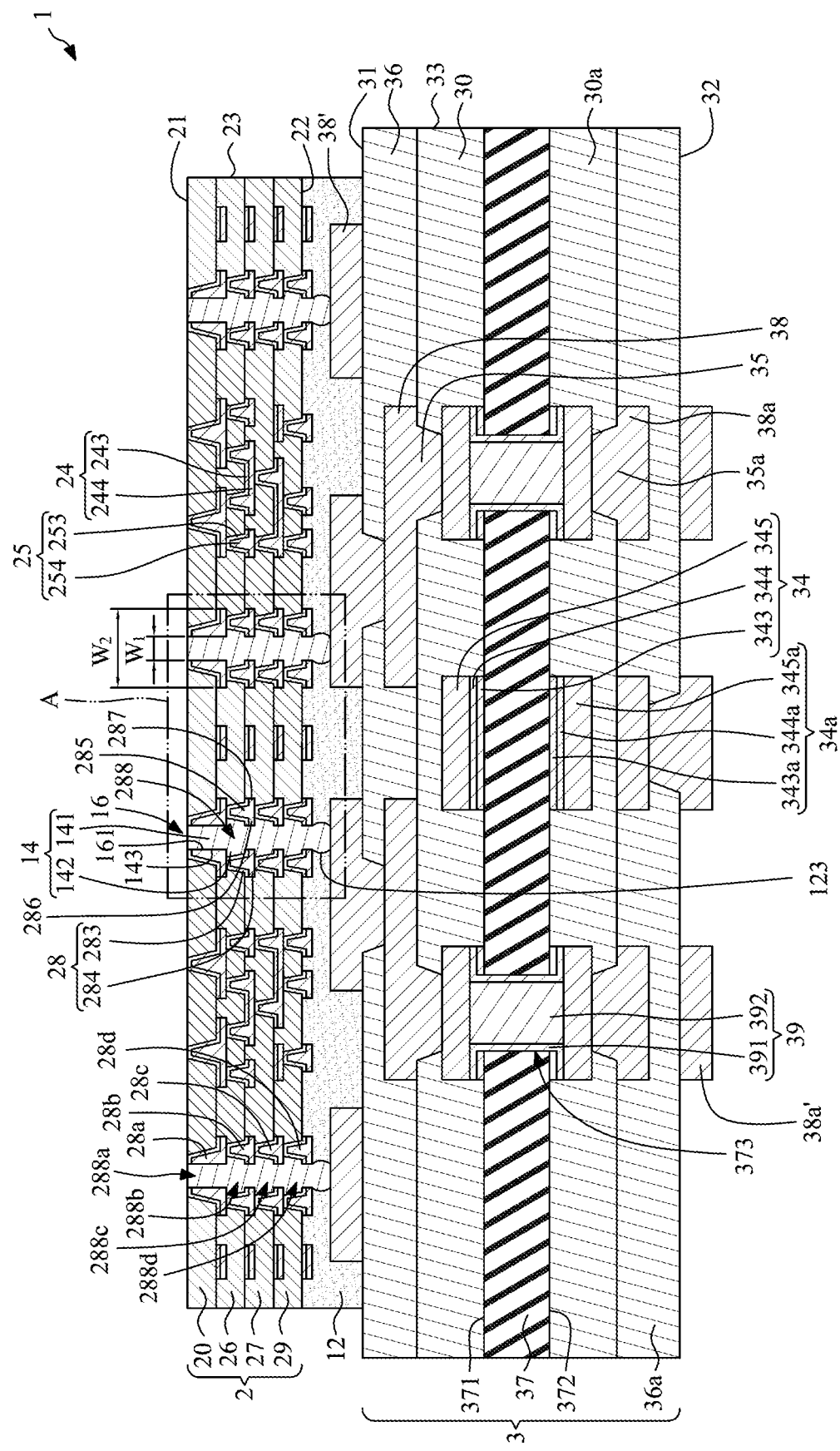
FIG. 1 illustrates a cross-sectional view of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
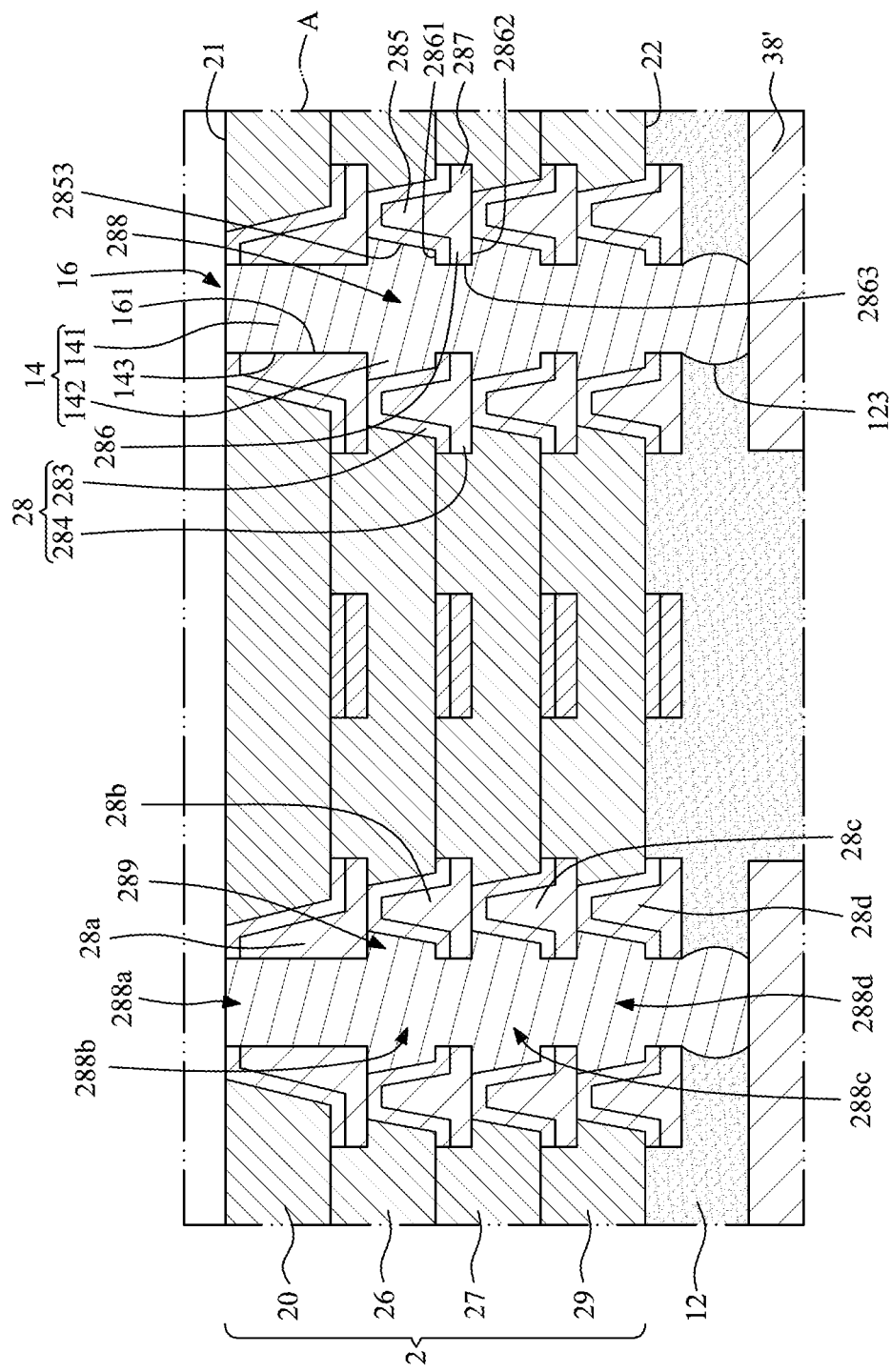
FIG. 2 illustrates a partially enlarged view of a region "A" in FIG. 1.
Figure 3:
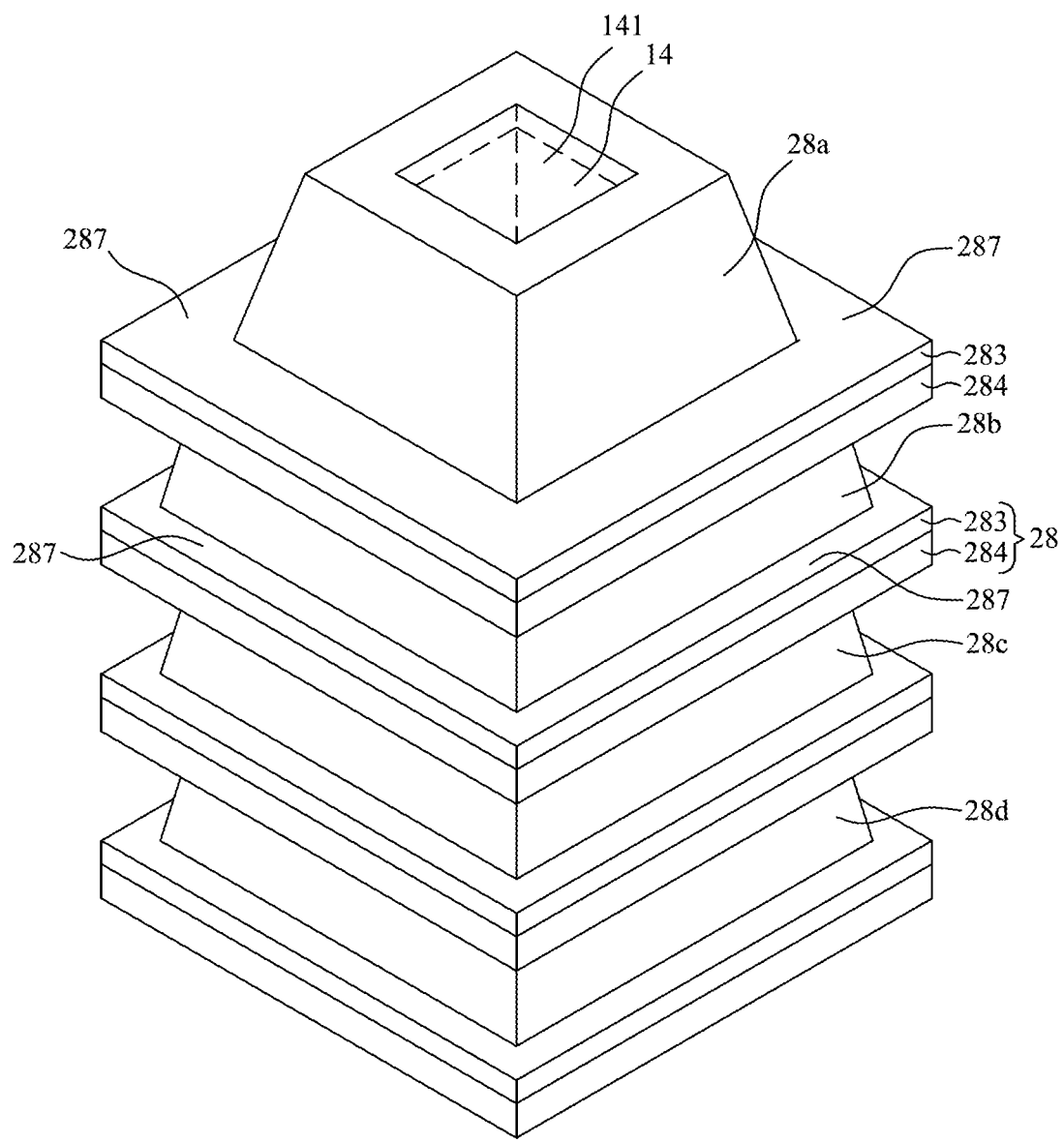
FIG. 3 illustrates a perspective view of FIG. 2, wherein the dielectric layers are omitted.

FIG. 1 illustrates a cross-sectional view of a wiring structure 1 according to some embodiments of the present disclosure. FIG. 2 illustrates a partially enlarged view of a region "A" in FIG. 1. FIG. 3 illustrates a perspective view of FIG. 2, wherein the dielectric layers are omitted. The wiring structure 1 may include an upper conductive structure (e.g., a conductive structure) 2 and at least one conductive through via 14. In some embodiments, the wiring structure 1 may further include an intermediate layer 12 and a lower conductive structure 3.

The upper conductive structure 2 is disposed on the lower conductive structure 3, and includes a plurality of dielectric layers (including, for example, a first dielectric layer 20, a second dielectric layer 26, a third dielectric layer 27 and a fourth dielectric layer 29), a plurality of circuit layers 24 (formed of a metal, a metal alloy, or other conductive material) in contact with the dielectric layers 20, 26, 27, 29, a plurality of dam portions 28 (formed of a metal, a metal alloy, or other conductive material) in contact with the dielectric layers 20, 26, 27, 29 and a plurality of inner conductive vias 25. In some embodiments, the upper conductive structure 2 may be similar to a coreless substrate, and may be a bumping level redistribution structure. The upper conductive structure 2 may be also referred to as "a high-density conductive structure" or "a high-density stacked structure". The circuit layers 24 of the upper conductive structure 2 may be also referred to as "a high-density circuit layer". In some embodiments, a density of a circuit line (including, for example, a trace or a pad) of the high-density circuit layer is greater than a density of a circuit line of a low-density circuit layer. That is, the count of the circuit line (including, for example, the trace or the pad) in a unit area of the high-density circuit layer is greater than the count of the circuit line in an equal unit area of the low-density circuit layer, such as about 1.2 times or greater, about 1.5 times or greater, or about 2 times or greater, or about 3 times or greater. Alternatively, or in combination, a line width/line space (L/S) of the high-density circuit layer is less than an L/S of the low-density circuit layer, such as about 90% or less, about 50% or less, or about 20% or less. Further, the conductive structure that includes the high-density circuit layer may be designated as the "high-density conductive structure", and the conductive structure that includes the low-density circuit layer may be designated as a "low-density conductive structure".

The upper conductive structure 2 has a top surface 21, a bottom surface 22 opposite to the top surface 21, and a lateral surface 23 extending between the top surface 21 and the bottom surface 22. As shown in FIG. 1, the dielectric layers 20, 26, 27, 29 are stacked on one another. For example, the first dielectric layer 20 may be the topmost dielectric layer. In some embodiments, a material of the dielectric layers 20, 26, 27, 29 is transparent, and can be seen through or detected by human eyes or machine. In some embodiments, a transparent material of the dielectric layers 20, 26, 27, 29 has a light transmission for a wavelength in the visible range (or other pertinent wavelength for detection of a mark) of at least about 60%, at least about 70%, or at least about 80%. In some embodiments, a material of the dielectric layers 20, 26, 27, 29 may be made of a cured photoimageable dielectric (PID) material such as epoxy or polyimide (PI) including photoinitiators.

The circuit layers 24 may be fan-out circuit layers or redistribution layers (RDLs), and an L/S of the circuit layers 24 may be less than about 10 μm/10 μm., less than or equal to 8 μm/8 μm, less than or equal to 5 μm/5 μm, less than or equal to 3 μm/3 μm, less than or equal to about 2 μm/about 2 μm, or less than or equal to about 1.8 μm/about 1.8 μm. In some embodiments, the circuit layer 24 is embedded in the corresponding dielectric layers 20, 26, 27, 29. In some embodiments, each circuit layer 24 may include a seed layer 243 and a conductive material 244 (e.g., a plating metallic material) disposed on the seed layer 243. As shown in FIG. 1, the bottommost circuit layer 24 is disposed on and protrudes from the bottom surface 22 of the upper conductive structure 2 (e.g., the bottom surface of the fourth dielectric layer 29). As illustrated in the embodiment of FIG. 1, a horizontally connecting or extending circuit layer is omitted in the first dielectric layer 20.

Some of the inner conductive vias 25 are disposed between two adjacent circuit layers 24 for electrically connecting the two circuit layers 24. Some of the inner conductive vias 25 are exposed from the top surface 21 of the upper conductive structure 2 (e.g., the top surface of the first dielectric layer 20). In some embodiments, each inner conductive via 25 may include a seed layer 253 and a conductive material 254 (e.g., a plating metallic material) disposed on the seed layer 253. Each inner conductive via 25 tapers upwardly along a direction from the bottom surface 22 towards the top surface 21 of the upper conductive structure 2.

As shown in FIG. 1 and FIG. 2, the dam portions 28 may include a first dam portion 28a, a second dam portion 28b, a third dam portion 28c and a fourth dam portion 28d. The dam portions 28 (e.g., the first dam portion 28a, the second dam portion 28b, the third dam portion 28c and the fourth dam portion 28d) are in contact with the dielectric layers (e.g., the first dielectric layer 20, the second dielectric layer 26, the third dielectric layer 27 and the fourth dielectric layer 29), and the dam portions 28 (e.g., the first dam portion 28a, the second dam portion 28b, the third dam portion 28c and the fourth dam portion 28d) are stacked on and contact one another. In some embodiments, each of the dam portions 28 may include a seed layer 283 and a conductive material 284 (e.g., a plating metallic material such as copper) disposed on the seed layer 283. In some embodiments, each of the dam portions 28, each inner conductive via 25 and the corresponding circuit layer 24 may be formed concurrently and integrally as a monolithic or one-piece structure. For example, the seed layer 283 of the dam portion 28, the seed layer 253 of the inner conductive via 25 and the seed layer 243 of the circuit layer 24 may be formed concurrently. Further, the conductive material 284 of the dam portion 28, the conductive material 254 of the inner conductive via 25 and the conductive material 244 of the circuit layer 24 may be formed concurrently. In some embodiments, at least one of the dam portions 28 may be electrically connected to a respective one of the circuit layers 24. However, in other embodiments, all of the dam portions 28 may be electrically isolated from the circuit layers 24.

As shown in FIGS. 2 and 3, each of the dam portions 28 (e.g., the first dam portion 28a, the second dam portion 28b, the third dam portion 28c and the fourth dam portion 28d) may be in a substantially closed ring shape. As shown in FIG. 2, each of the dam portions 28 may include a main portion 285 and at least one extending portion (including, for example, an inner extending portion 286 and an outer extending portion 287). Each of the main portions 285 may extend through a dielectric layer 20, 26, 27, 29 and define a through hole 288. The main portion 285 of each dam portions 28 tapers upwardly along a direction from the bottom surface 22 towards the top surface 21 of the upper conductive structure 2. The tapering direction of the inner conductive via 25 is same as the tapering direction of the dam portion 28. The extending portion (including, for example, the inner extending portion 286 and the outer extending portion 287) is disposed on a surface of the dielectric layer 20, 26, 27, 29. For example, the inner extending portion 286 may extend inwardly toward the through hole 288 so that a recess portion 289 may be formed between the main portion 285 and the inner extending portion 286. In addition, the outer extending portion 287 may extend opposite to the inner extending portion 286. In some embodiments, a cross section of one side of the dam portion 28 may be in an inverse T shape.

In some embodiments, the first dam portion 28a may extend through the first dielectric layer 20. The first dam portion 28a may not include an inner extending portion. The first dam portion 28a may only include the outer extending portion 287. Thus, the first dam portion 28a may define a through hole 288a having a substantially consistent width. A cross section of one side of the first dam portion 28a may be in an L shape. In addition, the second dam portion 28b may extend through the second dielectric layer 26. The second dam portion 28b may include the inner extending portion 286 and the outer extending portion 287. Thus, the second dam portion 28b may define a through hole 288b having a step profile. A cross section of one side of the second dam portion 28b may be in an inverse T shape. In addition, the third dam portion 28c may extend through the third dielectric layer 27. The third dam portion 28c may include the inner extending portion 286 and the outer extending portion 287. Thus, the third dam portion 28c may define a through hole 288c having a step profile. A cross section of one side of the third dam portion 28c may be in an inverse T shape. In addition, the fourth dam portion 28d may extend through the fourth dielectric layer 29. The fourth dam portion 28d may include the inner extending portion 286 and the outer extending portion 287. Thus, the fourth dam portion 28d may define a through hole 288d having a step profile. A cross section of one side of the fourth dam portion 28d may be in an inverse T shape. As shown in FIG. 1 and FIG. 2, a shape of the first dam portion 28a may be different from the shapes of the second dam portion 28b, the third dam portion 28c and the fourth dam portion 28d.

The stacked dam portions 28 (including the first dam portion 28a, the second dam portion 28b, the third dam portion 28c and the fourth dam portion 28d) may define an accommodating hole 16. That is, the accommodating hole 16 includes the through holes 288 (including the through holes 288a, 288b, 288c, 288d) of the stacked dam portions 28 (including the first dam portion 28a, the second dam portion 28b, the third dam portion 28c and the fourth dam portion 28d). As shown in FIG. 2, the accommodating hole 16 is a single hole that extends through all of the dam portions 28 (including the first dam portion 28a, the second dam portion 28b, the third dam portion 28c and the fourth dam portion 28d), and extends through the upper conductive structure 2. Alternatively, the accommodating hole 16 may be defined by the inner surfaces 2853 of the main portions 285, and the top surfaces 2861, the inner surfaces 2863 and the bottom surfaces 2862 of the inner extending portions 286. Further, an inner surface 161 (including, for example, the inner surfaces 2853 of the main portions 285, and the top surfaces 2861, the inner surfaces 2863 and the bottom surfaces 2862 of the inner extending portions 286) of the accommodating hole 16 is not a continuous or smooth surface since the inner surfaces 2853 of the main portions 285 and the inner surfaces 2863 of the inner extending portions 286 are not coplanar with each other.

The conductive through via 14 is disposed in and fills the accommodating hole 16. Thus, the conductive through via 14 is disposed in and fills the through holes 288 (including the through holes 288a, 288b, 288c, 288d) of the dam portions 28 (including the first dam portion 28a, the second dam portion 28b, the third dam portion 28c and the fourth dam portion 28d). The conductive through via 14 extends through and contacts the dam portions 28. The conductive through via 14 may be a monolithic or one-piece structure. A lateral side surface 143 (i.e., a boundary between the conductive through via 14 and the dam portions 28) of the conductive through via 14 is not a continuous or smooth surface since the inner surface 161 of the accommodating hole 16 is not a continuous or smooth surface. In some embodiments, the conductive through via 14 may include a conductive material (e.g., a plating metallic material such as copper). However, the conductive material of the conductive through via 14 may be different from the conductive material 284 of the dam portion 28. For example, the conductive material of the conductive through via 14 may include copper-iron composite, and the conductive material 284 of the dam portion 28 may include copper sulfate. In addition, a lattice of the conductive material of the conductive through via 14 may be different form a lattice of the conductive material 284 of the dam portion 28. A grain size of the conductive material of the conductive through via 14 may be greater than a grain size of the conductive material 284 of the dam portion 28.

In some embodiments, the conductive through via 14 may include a central portion 141 and a plurality of protrusion portions 142. A width W1 of the central portion 141 of the conductive through via 14 may be less than or equal to 20 μm, less than or equal to 15 μm, or less than or equal to 10 μm. The protrusion portions 142 protrude from the central portion 141 and correspond to the recess portions 289 of the dam portions 28.

In addition, a maximum width W2 of the dam portions 28 may be less than or equal to 30 μm, less than or equal to 25 μm, or less than or equal to 20 μm. As shown in FIG. 2, the sizes of the dam portions 28 may be substantially same as each other, and the widths of the through holes 288 of the dam portions 28 may be substantially equal to each other. The dam portions 28 may be aligned with each other. Thus, central portion 141 of the conductive through via 14 may have a consistent width, and the sizes of the protrusion portions 142 of the conductive through via 14 may be substantially same as each other. A cross section of one side of the protrusion portion 142 may be in a in a trapezoid shape.

The lower conductive structure 3 includes at least one dielectric layer (including, for example, one first upper dielectric layer 30, one second upper dielectric layer 36, one first lower dielectric layer 30a and one second lower dielectric layer 36a) and at least one circuit layer (including, for example, one first upper circuit layer 34, two second upper circuit layers 38, 38', one first lower circuit layer 34a and two second lower circuit layers 38a, 38a' formed of a metal, a metal alloy, or other conductive material) in contact with the dielectric layer (e.g., the first upper dielectric layer 30, the second upper dielectric layer 36, the first lower dielectric layer 30a and the second lower dielectric layer 36a). In some embodiments, the lower conductive structure 3 may be similar to a core substrate that further includes a core portion 37. The lower conductive structure 3 may be also referred to as "a lower stacked structure" or "a low-density conductive structure" or "a low-density stacked structure". The circuit layer (including, for example, the first upper circuit layer 34, the two second upper circuit layers 38, 38', the first lower circuit layer 34a and the two second lower circuit layers 38a, 38a') of the lower conductive structure 3 may be also referred to as "a low-density circuit layer". As shown in FIG. 1, the lower conductive structure 3 has a top surface 31, a bottom surface 32 opposite to the top surface 31, and a lateral surface 33 extending between the top surface 31 and the bottom surface 32. The lower conductive structure 3 may include a plurality of dielectric layers (for example, the first upper dielectric layer 30, the second upper dielectric layer 36, the first lower dielectric layer 30a and the second lower dielectric layer 36a), a plurality of circuit layers (for example, the first upper circuit layer 34, the two second upper circuit layers 38, 38', the first lower circuit layer 34a and the two second lower circuit layers 38a, 38a') and at least one inner conductive via (including, for example, a plurality of upper interconnection vias 35 and a plurality of lower interconnection vias 35a). As shown in FIG. 1, the lateral surface 23 of the upper conductive structure 2 may be displaced or recessed from the lateral surface 33 of the lower conductive structure 3.

The core portion 37 has a top surface 371 and a bottom surface 372 opposite to the top surface 371, and defines a plurality of first through holes 373 extending through the core portion 37. An interconnection via 39 is disposed or formed in each first through hole 373 for vertical connection. In some embodiments, the interconnection via 39 includes a base metallic layer 391 and an insulation material 392. The base metallic layer 391 is disposed or formed on a side wall of the first through hole 373, and defines a central through hole. The insulation material 392 fills the central through hole defined by the base metallic layer 391. In some embodiments, the interconnection via 39 may omit an insulation material, and may include a bulk metallic material that fills the first through hole 373.

The first upper dielectric layer 30 is disposed on the top surface 371 of the core portion 37. The second upper dielectric layer 36 is stacked or disposed on the first upper dielectric layer 30. In addition, the first lower dielectric layer 30a is disposed on the bottom surface 372 of the core portion 37. The second lower dielectric layer 36a is stacked or disposed on the first lower dielectric layer 30a.

A thickness of each of the dielectric layers 20, 26, 27, 29 of the upper conductive structure 2 is less than or equal to about 40%, less than or equal to about 35%, or less than or equal to about 30% of a thickness of each of the dielectric layers 30, 36, 30a, 36a of the lower conductive structure 3. For example, a thickness of each of the dielectric layers 20, 26, 27, 29 of the upper conductive structure 2 may be less than or equal to about 7 μm, and a thickness of each of the dielectric layers 30, 36, 30a, 36a of the lower conductive structure 3 may be about 40 μm. In addition, a material of the dielectric layers 30, 36, 30a, 36a of the lower conductive structure 3 may be different from the material of the dielectric layers 20, 26, 27, 29 of the upper conductive structure 2. For example, the material of the dielectric layers 30, 36, 30a, 36a of the lower conductive structure 3 may be polypropylene (PP) or ajinomoto build-up film (ABF).

An L/S of the first upper circuit layer 34 may be greater than or equal to about 10 μm/about 10 μm. Thus, the L/S of the first upper circuit layer 34 may be greater than or equal to about five times the L/S of the circuit layers 24 of the upper conductive structure 2. In some embodiments, the first upper circuit layer 34 is formed or disposed on the top surface 371 of the core portion 37, and covered by the first upper dielectric layer 30. In some embodiments, the first upper circuit layer 34 may include a first metallic layer 343, a second metallic layer 344 and a third metallic layer 345. The first metallic layer 343 is disposed on the top surface 371 of the core portion 37, and may be formed from a copper foil (e.g., may constitute a portion of the copper foil). The second metallic layer 344 is disposed on the first metallic layer 343, and may be a plated copper layer. The third metallic layer 345 is disposed on the second metallic layer 344, and may be another plated copper layer. In some embodiments, the third metallic layer 345 may be omitted.

An L/S of the second upper circuit layer 38 may be greater than or equal to about 10 μm/about 10 μm. Thus, the L/S of the second upper circuit layer 38 may be substantially equal to the L/S of the first upper circuit layer 34, and may be greater than or equal to about five times the L/S of the circuit layers 24 of the upper conductive structure 2. In some embodiments, the second upper circuit layer 38 is formed or disposed on the first upper dielectric layer 30, and covered by the second upper dielectric layer 36. In some embodiments, the second upper circuit layer 38 is electrically connected to the first upper circuit layer 34 through the upper interconnection vias 35. That is, the upper interconnection vias 35 are disposed between the second upper circuit layer 38 and the first upper circuit layer 34 for electrically connecting the second upper circuit layer 38 and the first upper circuit layer 34. In some embodiments, the second upper circuit layer 38 and the upper interconnection vias 35 are formed integrally as a monolithic or one-piece structure. Each upper interconnection via 35 tapers downwardly along a direction from the top surface 31 towards the bottom surface 32 of the lower conductive structure 3.

In addition, in some embodiments, the second upper circuit layer 38' is disposed on and protrudes from the top surface of the second upper dielectric layer 36. In some embodiments, the second upper circuit layer 38 is electrically connected to the second upper circuit layer 38' through the upper interconnection vias 35. In some embodiments, the second upper circuit layer 38' is the topmost circuit layer of the lower conductive structure 3.

An L/S of the first lower circuit layer 34a may be greater than or equal to about 10 μm/about 10 μm. Thus, the L/S of the first lower circuit layer 34a may be greater than or equal to about five times the L/S of the circuit layers 24 of the upper conductive structure 2. In some embodiments, the first lower circuit layer 34a is formed or disposed on the bottom surface 372 of the core portion 37, and covered by the first lower dielectric layer 30a. In some embodiments, the first lower circuit layer 34a may include a first metallic layer 343a, a second metallic layer 344a and a third metallic layer 345a. The first metallic layer 343a is disposed on the bottom surface 372 of the core portion 37, and may be formed from a copper foil. The second metallic layer 344a is disposed on the first metallic layer 343a, and may be a plated copper layer. The third metallic layer 345a is disposed on the second metallic layer 344a, and may be another plated copper layer. In some embodiments, the third metallic layer 345a may be omitted.

An L/S of the second lower circuit layer 38a may be greater than or equal to about 10 μm/about 10 μm. Thus, the L/S of the second lower circuit layer 38a may be substantially equal to the L/S of the first upper circuit layer 34, and may be greater than or equal to about five times the L/S of the circuit layers 24 of the upper conductive structure 2. In some embodiments, the second lower circuit layer 38a is formed or disposed on the first lower dielectric layer 30a, and covered by the second lower dielectric layer 36a. In some embodiments, the second lower circuit layer 38a is electrically connected to the first lower circuit layer 34a through the lower interconnection vias 35a. That is, the lower interconnection vias 35a are disposed between the second lower circuit layer 38a and the first lower circuit layer 34a for electrically connecting the second lower circuit layer 38a and the first lower circuit layer 34a. In some embodiments, the second lower circuit layer 38a and the lower interconnection vias 35a are formed integrally as a monolithic or one-piece structure. The lower interconnection via 35a tapers upwardly along a direction from the bottom surface 32 towards the top surface 31 of the lower conductive structure 3.

In addition, in some embodiments, the second lower circuit layer 38a' is disposed on and protrudes from the bottom surface of the second lower dielectric layer 36a. In some embodiments, the second lower circuit layer 38a' is electrically connected to the second lower circuit layer 38a through the lower interconnection vias 35a. That is, the lower interconnection vias 35a are disposed between the second lower circuit layers 38a, 38a' for electrically connecting the second lower circuit layers 38a, 38a'. In some embodiments, the second lower circuit layer 38a' is the bottommost low-density circuit layer of the lower conductive structure 3.

In some embodiments, each interconnection via 39 electrically connects the first upper circuit layer 34 and the first lower circuit layer 34a. The base metallic layer 391 of the interconnection via 39, the second metallic layer 344 of the first upper circuit layer 34 and the second metallic layer 344a the first lower circuit layer 34a may be formed integrally and concurrently as a monolithic or one-piece structure.

The intermediate layer 12 is interposed or disposed between the upper conductive structure 2 and the lower conductive structure 3 to bond the upper conductive structure 2 and the lower conductive structure 3 together. That is, the intermediate layer 12 adheres to the bottom surface 22 of the upper conductive structure 2 and the top surface 31 of the lower conductive structure 3. In some embodiments, the intermediate layer 12 may be an adhesion layer that is cured from an adhesive material (e.g., includes a cured adhesive material such as an adhesive polymeric material). Thus, the bottommost circuit layer 24 of the upper conductive structure 2 and the topmost circuit layer (e.g., the second upper circuit layer 38') of the lower conductive structure 3 are embedded in the intermediate layer 12. In some embodiments, a bonding force between two adjacent dielectric layers 20, 26, 27, 29 of the upper conductive structure 2 is greater than a bonding force between the fourth dielectric layer 29 of the upper conductive structure 2 and the intermediate layer 12. A surface roughness of a boundary between two adjacent dielectric layers 20, 26, 27, 29 of the upper conductive structure 2 is greater than a surface roughness of a boundary between a dielectric layer (e.g., the fourth dielectric layer 29) of the upper conductive structure 2 and the intermediate layer 12, such as about 1.1 times or greater, about 1.3 times or greater, or about 1.5 times or greater in terms of root mean squared surface roughness.

In some embodiments, a material of the intermediate layer 12 is transparent, and can be seen through by human eyes or machine. That is, a mark disposed adjacent to the top surface 31 of the lower conductive structure 3 can be recognized or detected from the top surface 21 of the upper conductive structure 2 by human eyes or machine. In addition, the material of intermediate layer 12 may be different from the material of the dielectric layers 30, 36, 30a, 36a of the lower conductive structure 3 and the material of the dielectric layers 20, 26, 27, 29 of the upper conductive structure 2. For example, the material of the intermediate layer 12 may be ABF, or ABF-like dielectric film.

The intermediate layer 12 defines at least one through hole 123. In some embodiments, the through hole 123 of the intermediate layer 12 extends through the upper conductive structure 2 and terminates at or on a topmost circuit layer (e.g., the second upper circuit layer 38') of the lower conductive structure 3. In some embodiments, the sidewall of the through hole 123 of the intermediate layer 12 may be curved since it may be formed by plasma. The through hole 123 of the intermediate layer 12 may expose a portion of the topmost circuit layer (e.g., a top surface of the second upper circuit layer 38') of the lower conductive structure 3.

As shown in FIG. 1, the through hole 123 of the intermediate layer 12 may be aligned with and in communication with the accommodating hole 16 of the upper conductive structure 2 for accommodating the conductive through via 14. Thus, a bottom portion of the conductive through via 14 may be disposed in the through hole 123 of the intermediate layer 12. The conductive through via 14 may further extend through the through hole 123 of the intermediate layer 12, and is electrically connected to the topmost circuit layer (e.g., the top surface of the second upper circuit layer 38') of the lower conductive structure 3. The conductive through via 14 extends from the top surface 21 of the upper conductive structure 2 to the bottom surface of the intermediate layer 12 to terminate at or on a portion of the topmost circuit layer (e.g., the top surface of the second upper circuit layer 38') of the lower conductive structure 3. Thus, a length of the conductive through via 14 is greater than a thickness of the upper conductive structure 2. In some embodiments, the upper conductive structure 2 is electrically connected to the lower conductive structure 3 only through the conductive through via 14.

As shown in the embodiment illustrated in FIG. 1 to FIG. 3, the wiring structure 1 is a combination of the upper conductive structure 2 and the lower conductive structure 3, in which the circuit layers 24 of the upper conductive structure 2 has fine pitch, high yield and low thickness; and the circuit layers (for example, the first upper circuit layer 34, the second upper circuit layers 38, 38', the first lower circuit layer 34a and the second lower circuit layers 38a, 38a') of the lower conductive structure 3 have low manufacturing cost. Thus, the wiring structure 1 has an advantageous compromise of yield and manufacturing cost, and the wiring structure 1 has a relatively low thickness. The manufacturing yield for one layer of the circuit layers 24 of the upper conductive structure 2 may be 99%, and the manufacturing yield for one layer of the circuit layers (for example, the first upper circuit layer 34, the second upper circuit layers 38, 38', the first lower circuit layer 34a and the second lower circuit layers 38a, 38a') of the lower conductive structure 3 may be 90%. Thus, the yield of the wiring structure 1 may be improved. In addition, the warpage of the upper conductive structure 2 and the warpage of the lower conductive structure 3 are separated and will not influence each other. Thus, the warpage of the lower conductive structure 3 will not be accumulated onto the warpage of the upper conductive structure 2. Thus, the yield of the wiring structure 1 may be further improved.

In addition, during the manufacturing process, the accommodating hole 16 (including the through holes 288 of the dam portions 28) of the upper conductive structure 2 may be formed by removing portions of the dielectric layers 20, 26, 27, 29 in the through holes 288 of the dam portions 28 by plasma. Thus, a width and a profile of the accommodating hole 16 are defined and limited by the solid portions of the dam portions 28. As a result, a width of the accommodating hole 16 may be relatively small, and the accommodating hole 16 may not have a barrel shape. Accordingly, the width of the conductive through via 14 may be relatively small, and the conductive through via 14 may not have a barrel shape.

Figure 4:
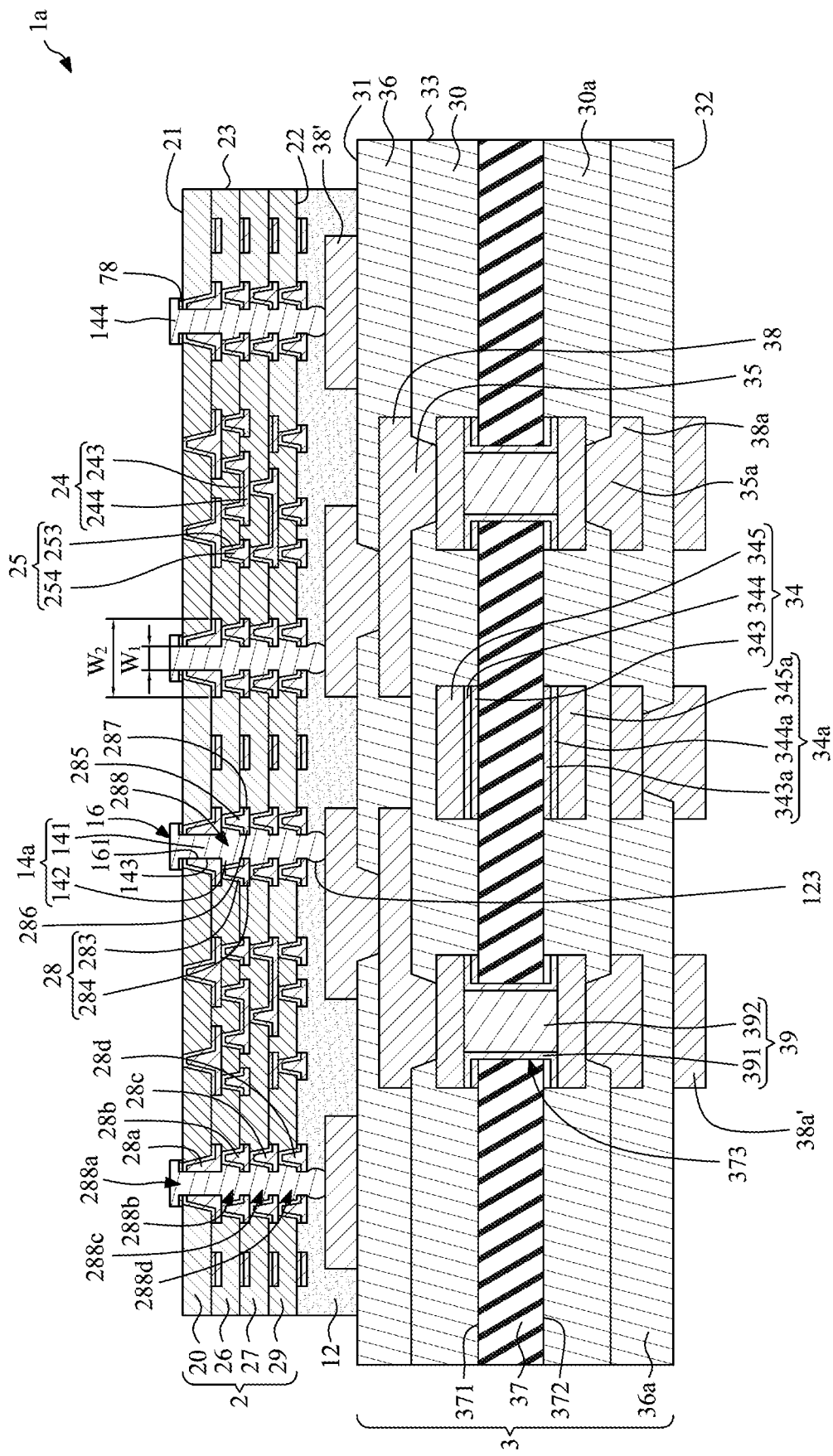
FIG. 4 illustrates a cross-sectional view of a wiring structure according to some embodiments of the present disclosure.

FIG. 4 illustrates a cross-sectional view of a wiring structure 1a according to some embodiments of the present disclosure. The wiring structure 1a is similar to the wiring structure 1 shown in FIG. 1, except for a structure of the conductive through via 14a. As shown in FIG. 4, a top portion 144 of the conductive through via 14a protrudes from and covers the top surface 21 of the upper conductive structure 2. In addition, the wiring structure 1a further includes a seed layer 78 interposed between the top portion 144 of the conductive through via 14a and the top surface 21 of the upper conductive structure 2. In some embodiments, the seed layer 78 may further extend to cover the inner surface 161 of the accommodating hole 16, and contact the lateral side surface 143 of the conductive through via 14a. That is, the seed layer 78 may be interposed between the inner surface 161 of the accommodating hole 16 and the lateral side surface 143 of the conductive through via 14a.

Figure 5:
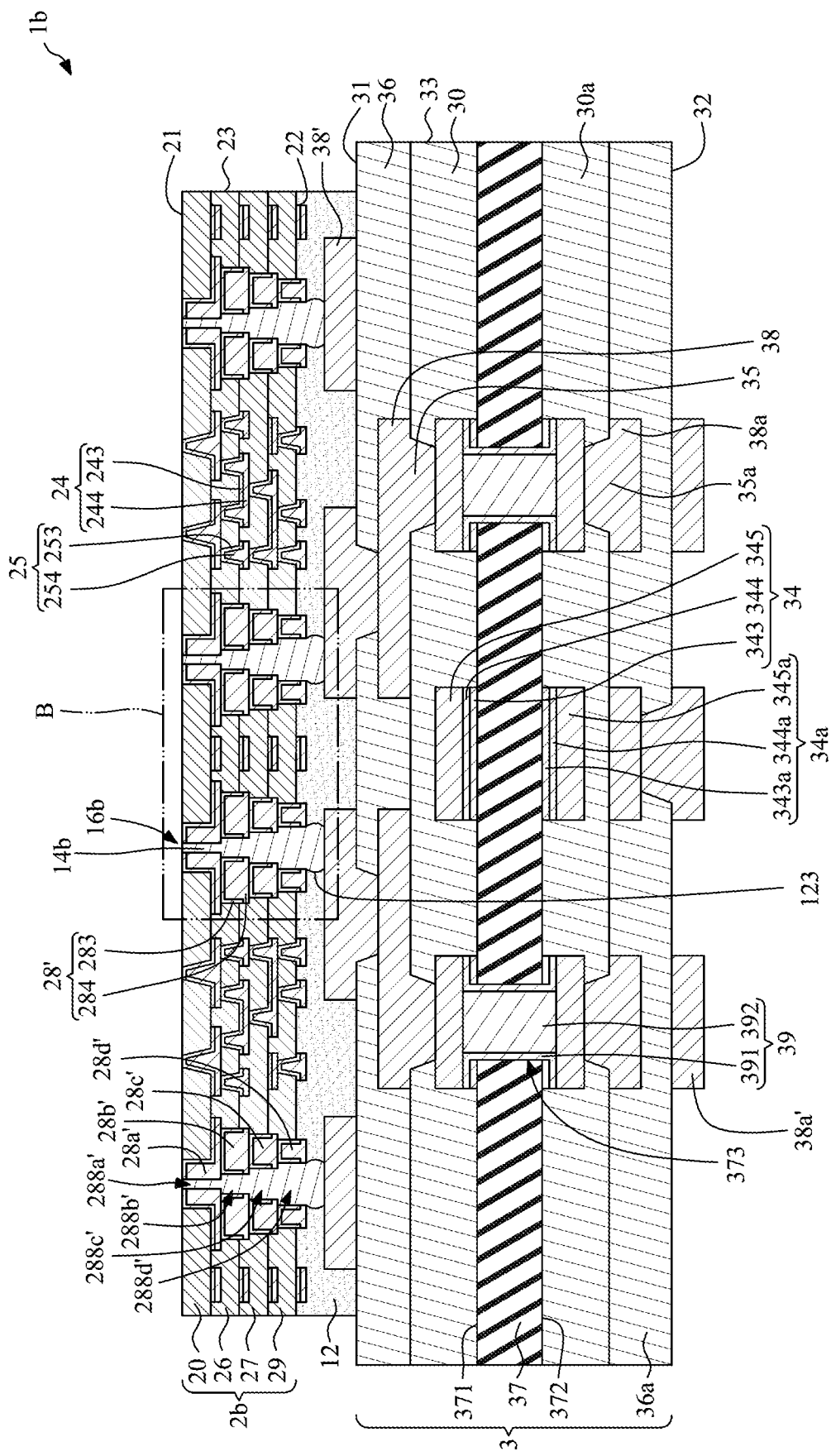
FIG. 5 illustrates a cross-sectional view of a wiring structure according to some embodiments of the present disclosure.
Figure 6:
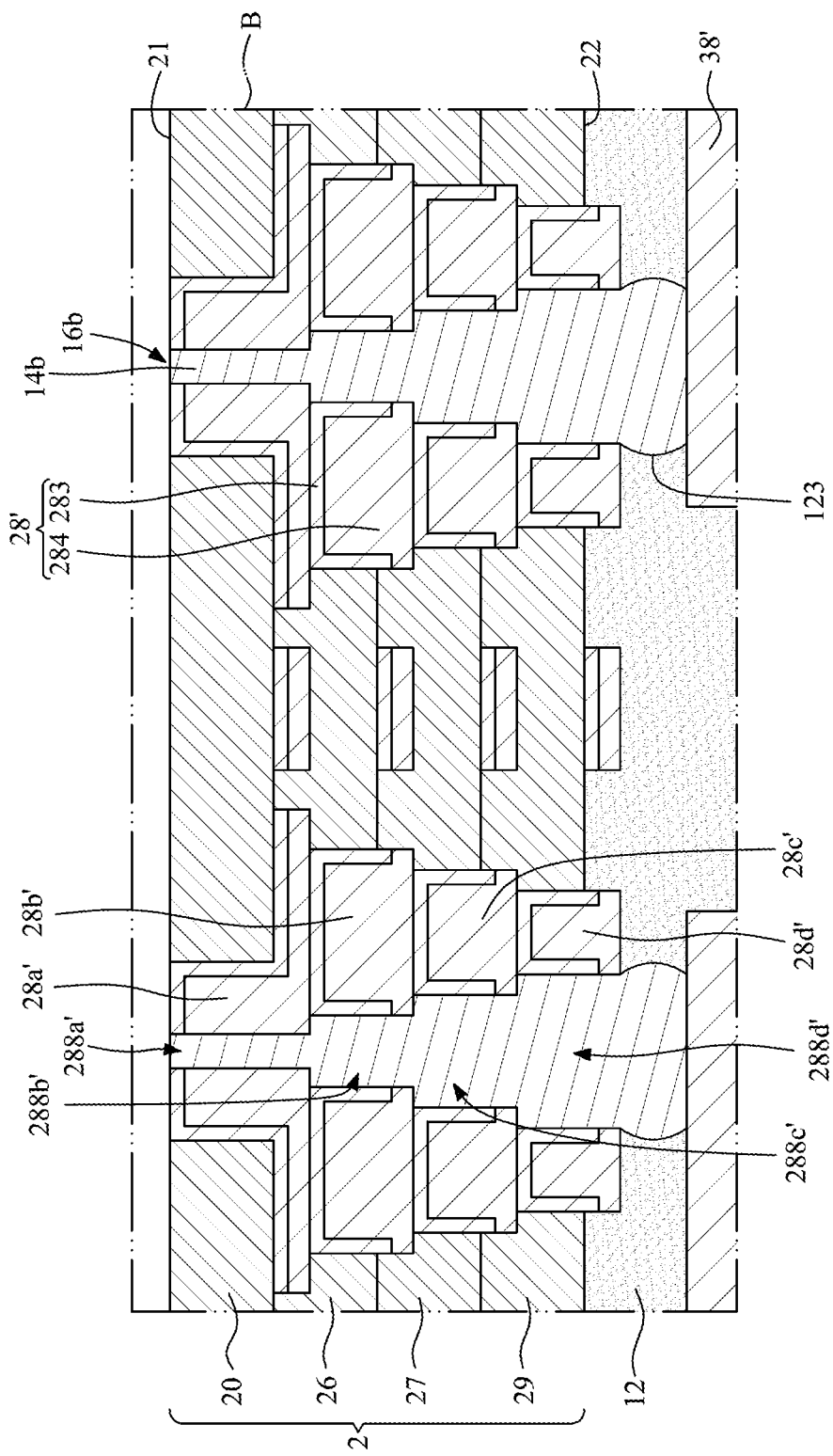
FIG. 6 illustrates a partially enlarged view of a region "B" in FIG. 5.

FIG. 5 illustrates a cross-sectional view of a wiring structure 1b according to some embodiments of the present disclosure. FIG. 6 illustrates a partially enlarged view of a region "B" in FIG. 5. The wiring structure 1b is similar to the wiring structure 1 shown in FIG. 1 and FIG. 2, except for the structures of the dam portions 28' and the conductive through via 14b of the upper conductive structure 2b. The dam portions 28' of FIG. 5 and FIG. 6 may include a first dam portion 28a', a second dam portion 28b', a third dam portion 28c' and a fourth dam portion 28d'

The first dam portion 28a' may be similar to the first dam portion 28a of FIG. 1 and FIG. 2, and may define a through hole 288a'. In addition, the second dam portion 28b' of FIG. 5 and FIG. 6 may be similar to the second dam portion 28b of FIG. 1 and FIG. 2 except that the second dam portion 28b' may not include the extending portion (including, for example, the inner extending portion 286 and the outer extending portion 287 of FIG. 2). Thus, a cross section of one side of the second dam portion 28b' may be in a rectangular shape. The second dam portion 28b' defines a through hole 288b' having a substantially consistent width. In addition, the third dam portion 28c' of FIG. 5 and FIG. 6 may be similar to the third dam portion 28c of FIG. 1 and FIG. 2 except that the third dam portion 28c' may not include the extending portion (including, for example, the inner extending portion 286 and the outer extending portion 287 of FIG. 2). Thus, a cross section of one side of the third dam portion 28c' may be in a rectangular shape. The third dam portion 28c' defines a through hole 288c' having a substantially consistent width. In addition, the fourth dam portion 28d' of FIG. 5 and FIG. 6 may be similar to the fourth dam portion 28d of FIG. 1 and FIG. 2 except that the fourth dam portion 28d' may not include the extending portion (including, for example, the inner extending portion 286 and the outer extending portion 287 of FIG. 2). Thus, a cross section of one side of the fourth dam portion 28d' may be in a rectangular shape. The fourth dam portion 28d' defines a through hole 288d' having a substantially consistent width.

A width of the through hole 288b' of the second dam portion 28b' may be greater than a width of the through hole 288a' of the first dam portion 28a'. A width of the through hole 288c' of the third dam portion 28c' may be greater than the width of the through hole 288b' of the second dam portion 28b'. A width of the through hole 288d' of the fourth dam portion 28d' may be greater than the width of the through hole 288c' of the third dam portion 28c'. Thus, the widths of the through holes (i.e., the through holes 288d', 288c', 288b', 288a') may gradually decrease from a bottommost dam portion (i.e., the fourth dam portion 28d') to a topmost dam portion (i.e., the first dam portion 28a').

The stacked dam portions 28' (including the first dam portion 28a', the second dam portion 28b', the third dam portion 28c' and the fourth dam portion 28d') may define an accommodating hole 16b. The conductive through via 14b may be disposed in the accommodating hole 16b. A cross section of one side of the conductive through via 14b may be in a step structure.

Figure 7:
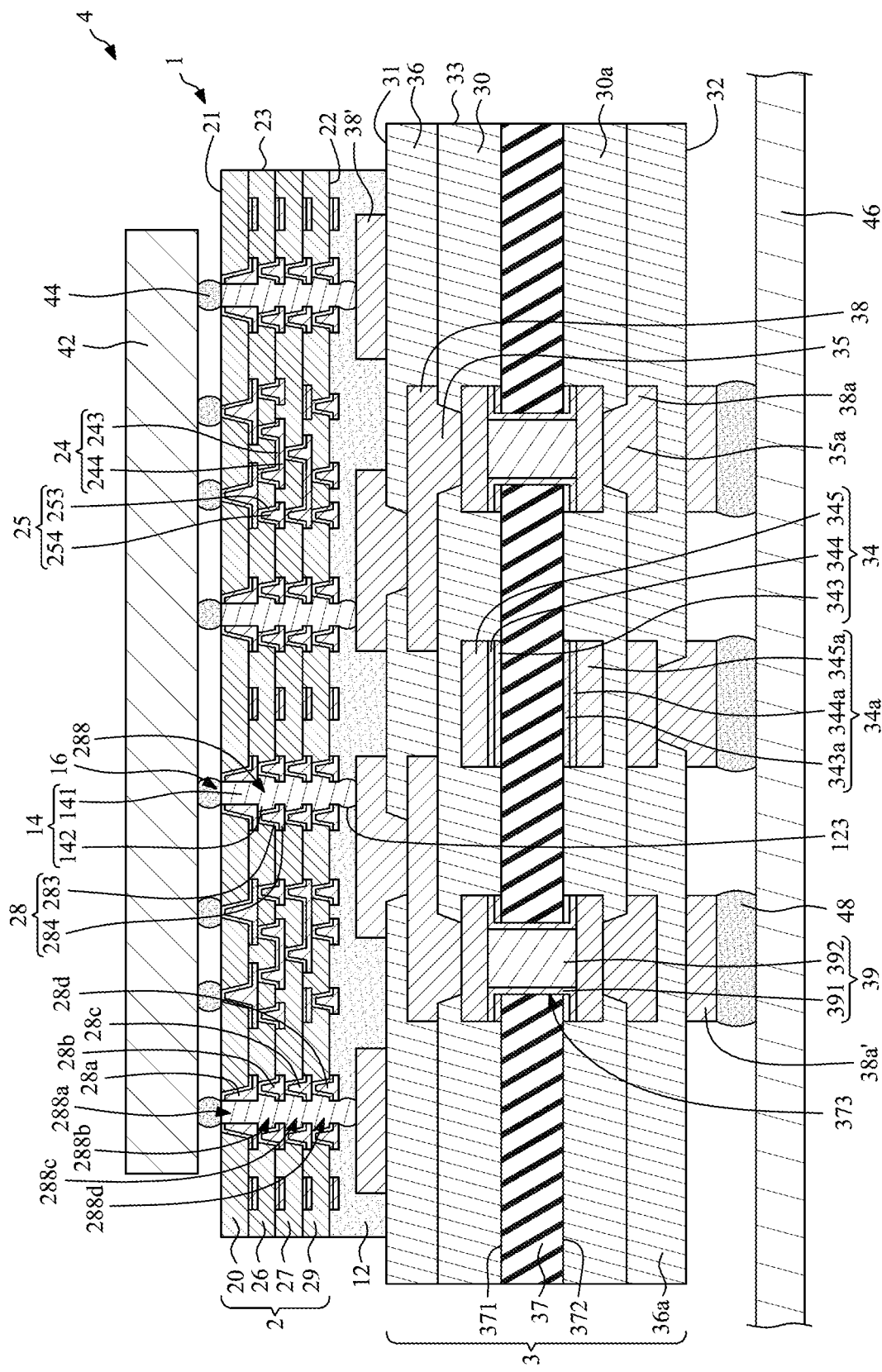
FIG. 7 illustrates a cross-sectional view of a bonding of a package structure and a substrate according to some embodiments of the present disclosure.

FIG. 7 illustrates a cross-sectional view of a bonding of a package structure 4 and a substrate 46 according to some embodiments. The package structure 4 includes a wiring structure 1, a semiconductor chip 42, a plurality of first connecting elements 44 and a plurality of second connecting elements 48. The wiring structure 1 of FIG. 7 is similar to the wiring structure 1 shown in FIG. 1. The semiconductor chip 42 is electrically connected and bonded to the conductive through via(s) 14 and the exposed inner conductive via 25 of the upper conductive structure 2 through the first connecting elements 44 (e.g., solder bumps or other conductive bumps). Thus, the semiconductor chip 42 may be electrically connected to the lower conductive structure 3 directly through the conductive through via(s) 14. The second lower circuit layer 38a' of the lower conductive structure 3 is electrically connected and bonded to the substrate 46 (e.g., a mother board such as a printed circuit board (PCB)) through the second connecting elements 48 (e.g., solder bumps or other conductive bumps).

FIG. 8 through FIG. 37 illustrate a method for manufacturing a wiring structure according to some embodiments of the present disclosure. In some embodiments, the method is for manufacturing the wiring structure 1 shown in FIG. 1.

Figure 8:
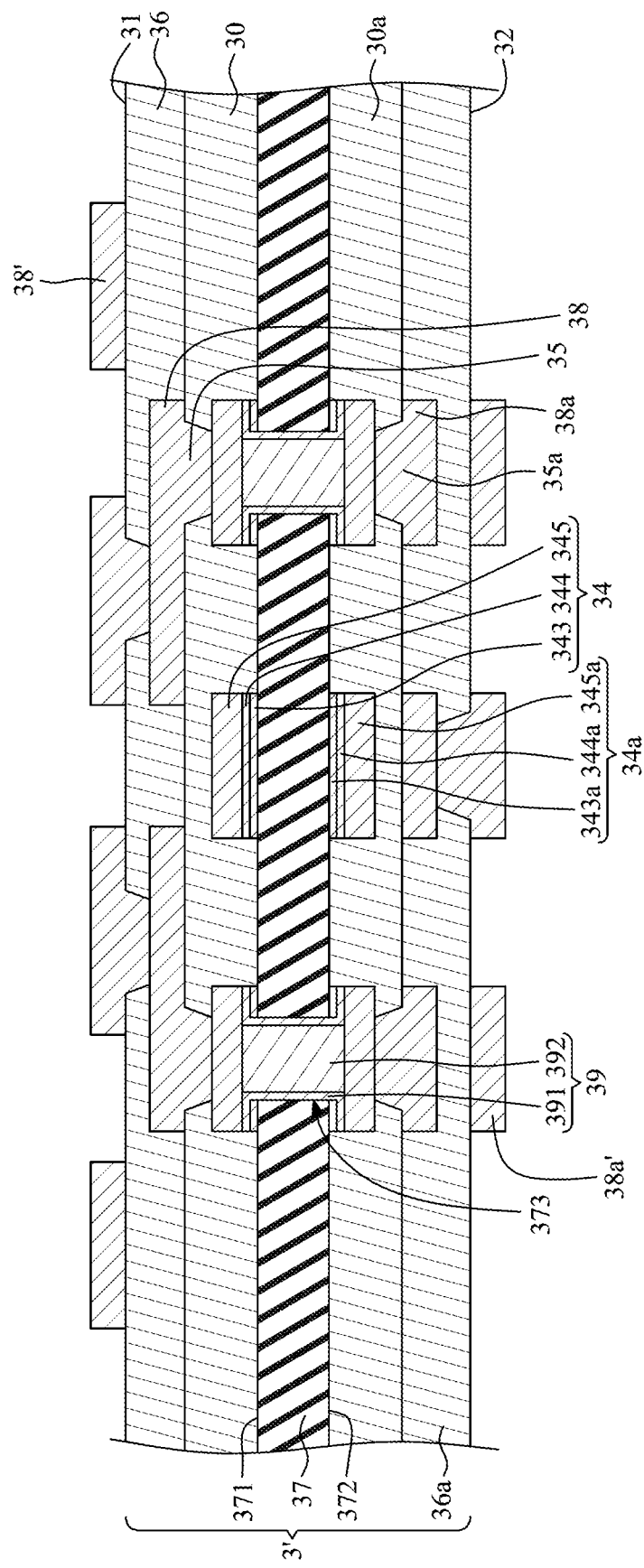
FIG. 8 illustrates one or more stages of an example of a method for manufacturing a wiring structure according to some embodiments of the present disclosure.

Referring to FIG. 8, a lower conductive structure 3' is provided. The lower conductive structure 3' is similar to the lower conductive structure 3 of FIG. 1, and includes the dielectric layers 30, 36, 30a, 36a, the circuit layers 34, 38, 38', 34a, 38a, 38a', the core portion 37, the upper interconnection vias 35 and the lower interconnection vias 35a. An electrical property (such as open circuit/short circuit) of the lower conductive structure 3' may be tested.

Figure 9:
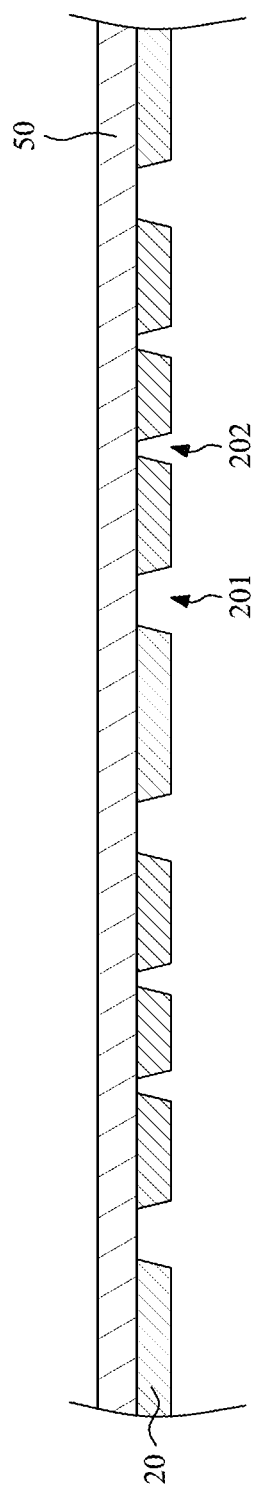
FIG. 9 illustrates one or more stages of an example of a method for manufacturing a wiring structure according to some embodiments of the present disclosure.

Referring to FIG. 9 through FIG. 29, an upper conductive structure 2 is provided. The upper conductive structure 2 is manufactured as follows. Referring to FIG. 9, a carrier 50 is provided. The carrier 50 may be a glass carrier, and may be in a wafer type, a panel type or a strip type. Then, a patterned first dielectric layer 20 is formed on the carrier 50. The patterned first dielectric layer 20 defines at least one first opening 201 and at least one second opening 202 extending through the first dielectric layer 20. A width of the first opening 201 may be equal to or greater than a width of the second opening 202.

Figure 10:
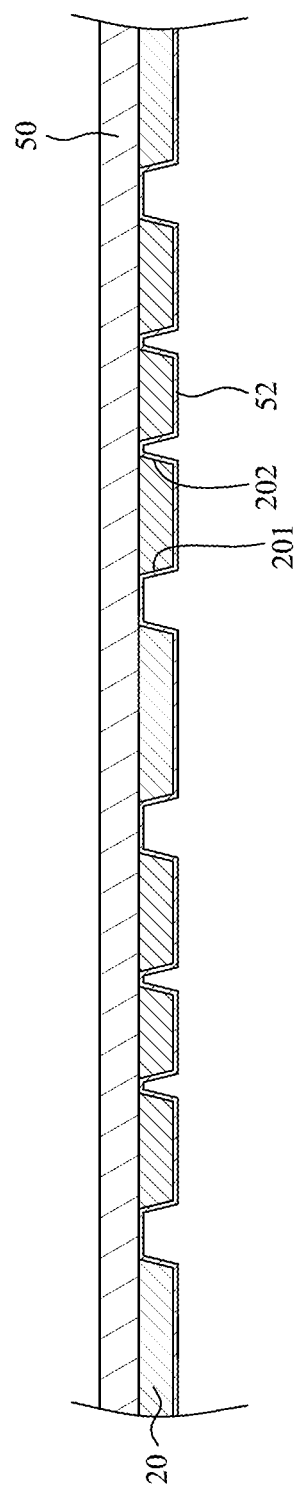
FIG. 10 illustrates one or more stages of an example of a method for manufacturing a wiring structure according to some embodiments of the present disclosure.

Referring to FIG. 10, a seed layer 52 is formed or disposed on the first dielectric layer 20, the first opening 201 and the second opening 202 by a physical vapor deposition (PVD) technique or other suitable techniques.

Figure 11:
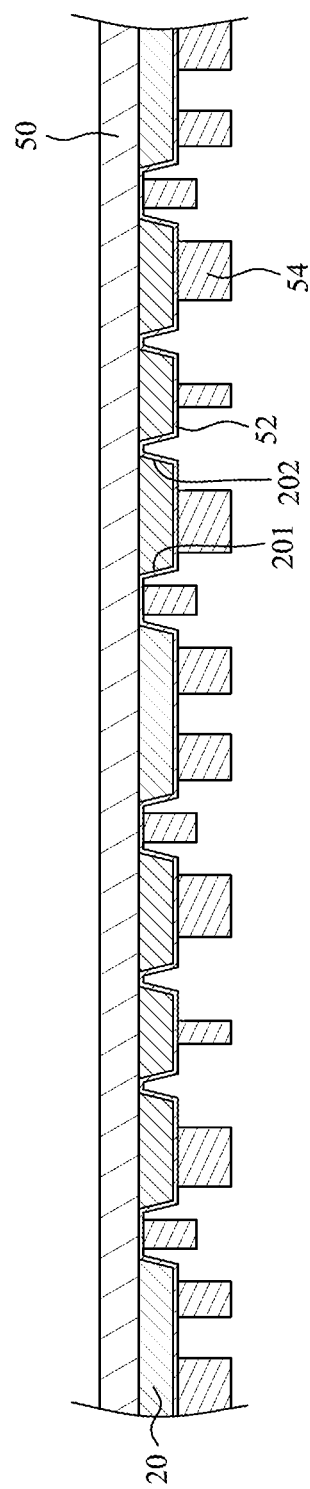
FIG. 11 illustrates one or more stages of an example of a method for manufacturing a wiring structure according to some embodiments of the present disclosure.

Referring to FIG. 11, a first photoresist layer 54 is formed or disposed on the seed layer 52. Then, the first photoresist layer 54 is patterned to form a plurality of openings to expose portions of the seed layer 52 by an exposure and development technique or other suitable techniques. A portion of the first photoresist layer 54 may be disposed in the first opening 201 of the first dielectric layer 20.

Figure 12:
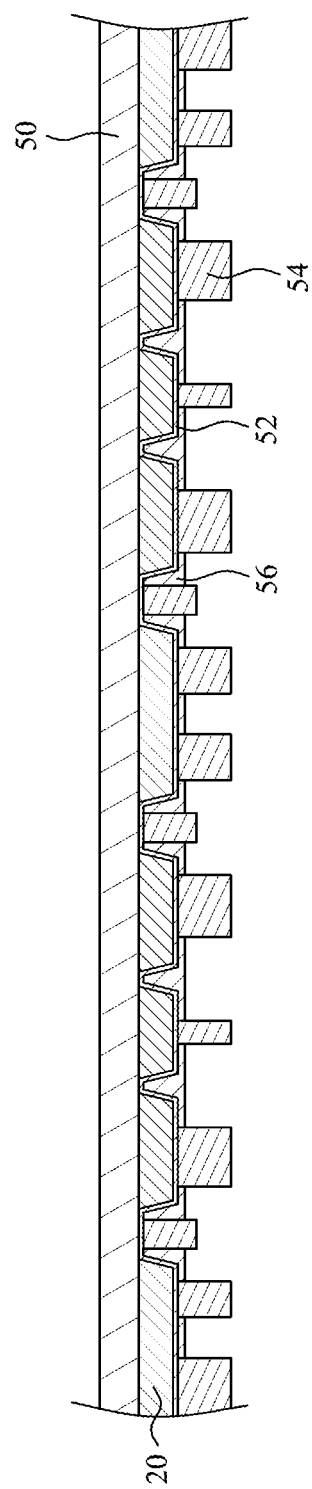
FIG. 12 illustrates one or more stages of an example of a method for manufacturing a wiring structure according to some embodiments of the present disclosure.

Referring to FIG. 12, a conductive material 56 (e.g., a metallic material) is disposed in the openings of the first photoresist layer 54 and on the seed layer 52 by a plating technique or other suitable techniques.

Figure 13:
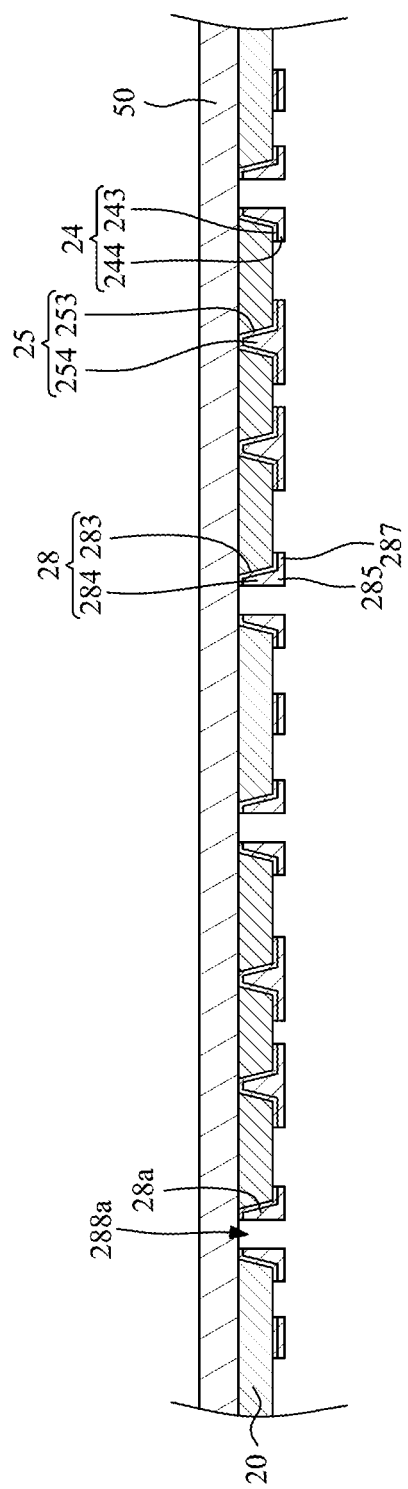
FIG. 13 illustrates one or more stages of an example of a method for manufacturing a wiring structure according to some embodiments of the present disclosure.

Referring to FIG. 13, the first photoresist layer 54 is removed by a stripping technique or other suitable techniques. Then, portions of the seed layer 52 that are not covered by the conductive material 56 are removed by an etching technique or other suitable techniques. Meanwhile, a circuit layer 24, at least one inner conductive via 25 and at least one dam portion 28 (e.g., a first dam portion 28a) are formed. The circuit layer 24 is disposed on a bottom surface of the first dielectric layer 20, and include a seed layer 243 formed from the seed layer 52 and a conductive material 244 disposed on the seed layer 243 and formed from the conductive material 56. The inner conductive via 25 is disposed in the second opening 202 of the first dielectric layer 20, and includes a seed layer 253 formed from the seed layer 52 and a conductive material 254 disposed on the seed layer 253 and formed from the conductive material 56. The dam portion 28 (e.g., the first dam portion 28a) is disposed in the first opening 201 of the first dielectric layer 20, and includes a seed layer 283 formed from the seed layer 52 and a conductive material 284 disposed on the seed layer 283 and formed from the conductive material 56. The dam portion 28 (e.g., the first dam portion 28a) may include a main portion 285 and at least one extending portion (including, for example, an outer extending portion 287). The main portions 285 may extend through the first dielectric layer 20, and define a through hole 288a. The outer extending portion 287 is disposed on a bottom surface of the first dielectric layer 20.

Figure 14:
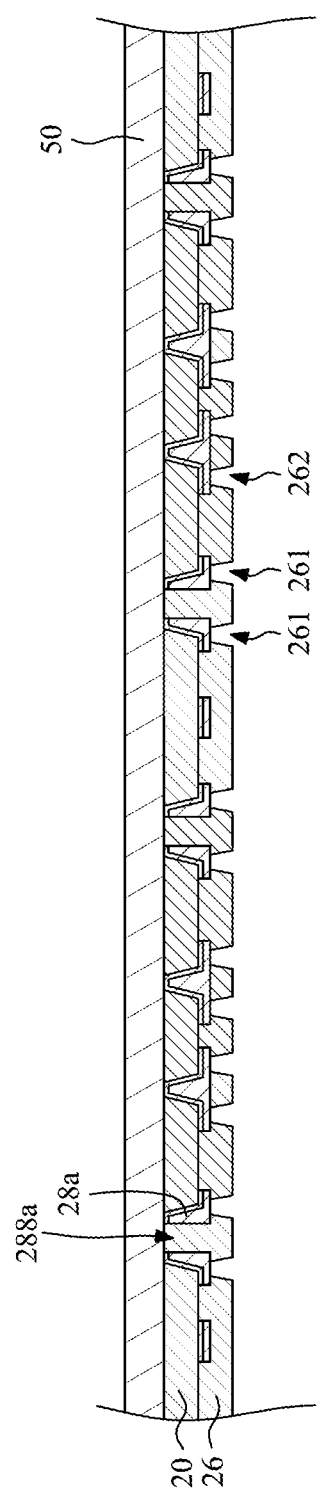
FIG. 14 illustrates one or more stages of an example of a method for manufacturing a wiring structure according to some embodiments of the present disclosure.

Referring to FIG. 14, a patterned second dielectric layer 26 is formed on the first dielectric layer 20 to cover the circuit layer 24. The patterned second dielectric layer 26 defines at least one ring groove 261 and at least one second opening 262 extending through the second dielectric layer 26. The ring groove 261 is disposed on the first dam portion 28a so as to expose a portion of the first dam portion 28a.

The second opening 262 is disposed on the circuit layer 24 so as to expose a portion of the circuit layer 24.

Figure 15:
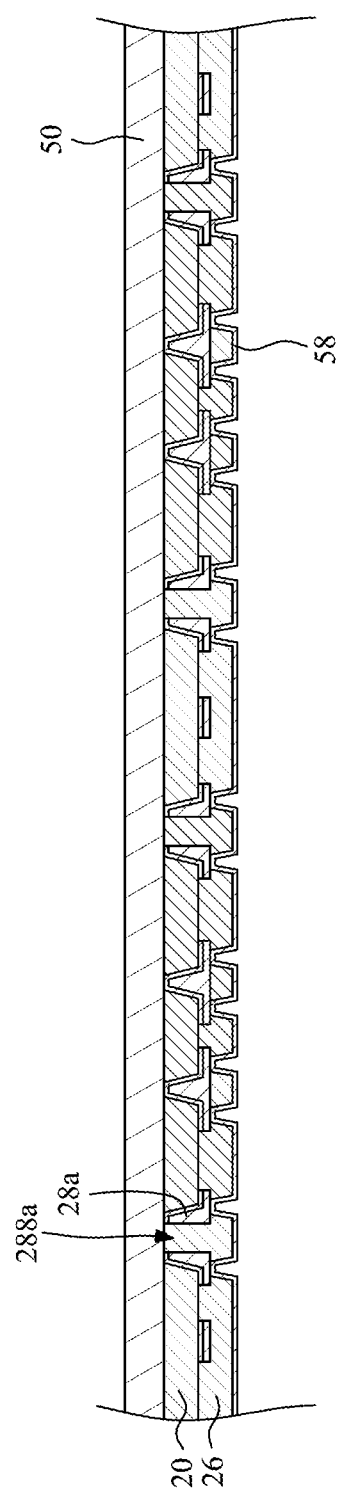
FIG. 15 illustrates one or more stages of an example of a method for manufacturing a wiring structure according to some embodiments of the present disclosure.

Referring to FIG. 15, a seed layer 58 is formed or disposed on the second dielectric layer 26, the ring groove 261 and the second opening 262 by a physical vapor deposition (PVD) technique or other suitable techniques.

Figure 16:
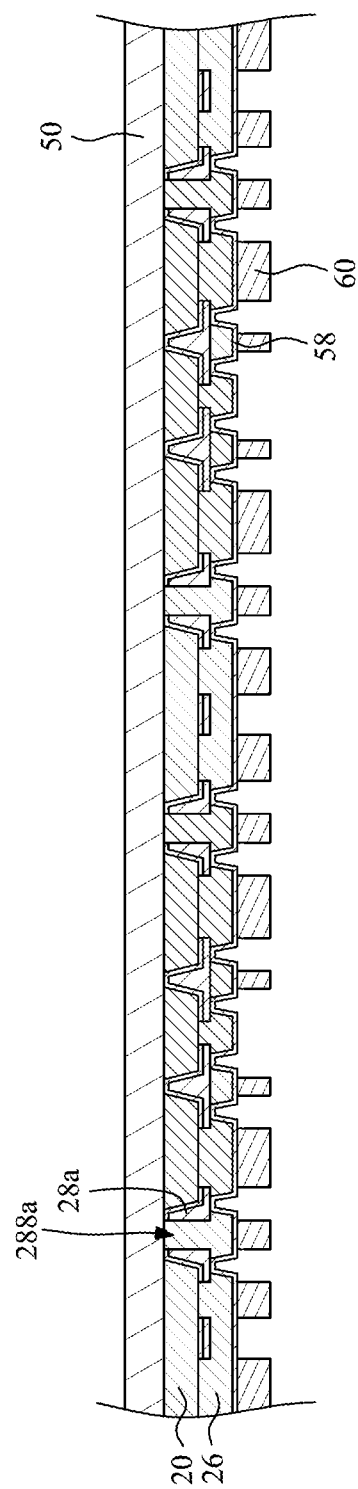
FIG. 16 illustrates one or more stages of an example of a method for manufacturing a wiring structure according to some embodiments of the present disclosure.

Referring to FIG. 16, a second photoresist layer 60 is formed or disposed on the seed layer 58. Then, the second photoresist layer 60 is patterned to form a plurality of openings to expose portions of the seed layer 58 by an exposure and development technique or other suitable techniques.

Figure 17:
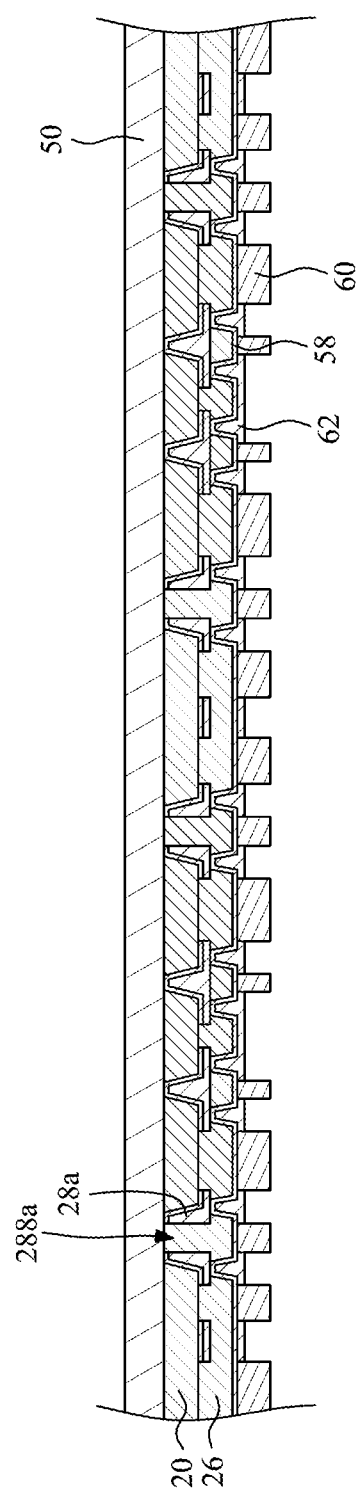
FIG. 17 illustrates one or more stages of an example of a method for manufacturing a wiring structure according to some embodiments of the present disclosure.

Referring to FIG. 17, a conductive material 62 (e.g., a metallic material) is disposed in the openings of the second photoresist layer 60 and on the seed layer 58 by a plating technique or other suitable techniques.

Figure 18:
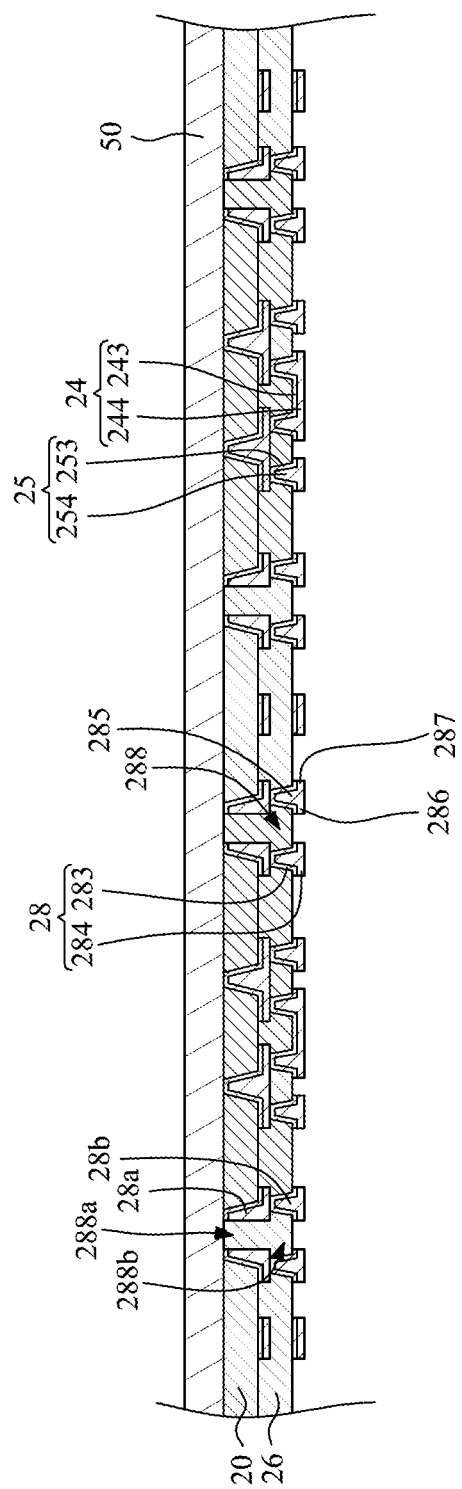
FIG. 18 illustrates one or more stages of an example of a method for manufacturing a wiring structure according to some embodiments of the present disclosure.

Referring to FIG. 18, the second photoresist layer 60 is removed by a stripping technique or other suitable techniques. Then, portions of the seed layer 58 that are not covered by the conductive material 62 are removed by an etching technique or other suitable techniques. Meanwhile, a circuit layer 24, at least one inner conductive via 25 and at least one dam portion 28 (e.g., a second dam portion 28b) are formed. The circuit layer 24 is disposed on a bottom surface of the second dielectric layer 26, and include a seed layer 243 formed from the seed layer 58 and a conductive material 244 disposed on the seed layer 243 and formed from the conductive material 62. The inner conductive via 25 is disposed in the second opening 262 of the second dielectric layer 26, and includes a seed layer 253 formed from the seed layer 58 and a conductive material 254 disposed on the seed layer 253 and formed from the conductive material 62. The dam portion 28 (e.g., the second dam portion 28b) is disposed in the ring groove 261 of the second dielectric layer 26, and includes a seed layer 283 formed from the seed layer 58 and a conductive material 284 disposed on the seed layer 283 and formed from the conductive material 62. The dam portion 28 (e.g., the second dam portion 28b) may include a main portion 285 and at least one extending portion (including, for example, an inner extending portion 286 and an outer extending portion 287). The main portion 285 is disposed in the ring groove 261 and extends through the second dielectric layer 26. The main portions 285 may contact the first dam portion 28a and define a through hole 288b. The extending portion (including, the inner extending portion 286 and the outer extending portion 287) is disposed on a bottom surface of the second dielectric layer 26. The inner extending portion 286 may extend inwardly toward the through hole 288b. In addition, the outer extending portion 287 may extend opposite to the inner extending portion 286.

Figure 19:
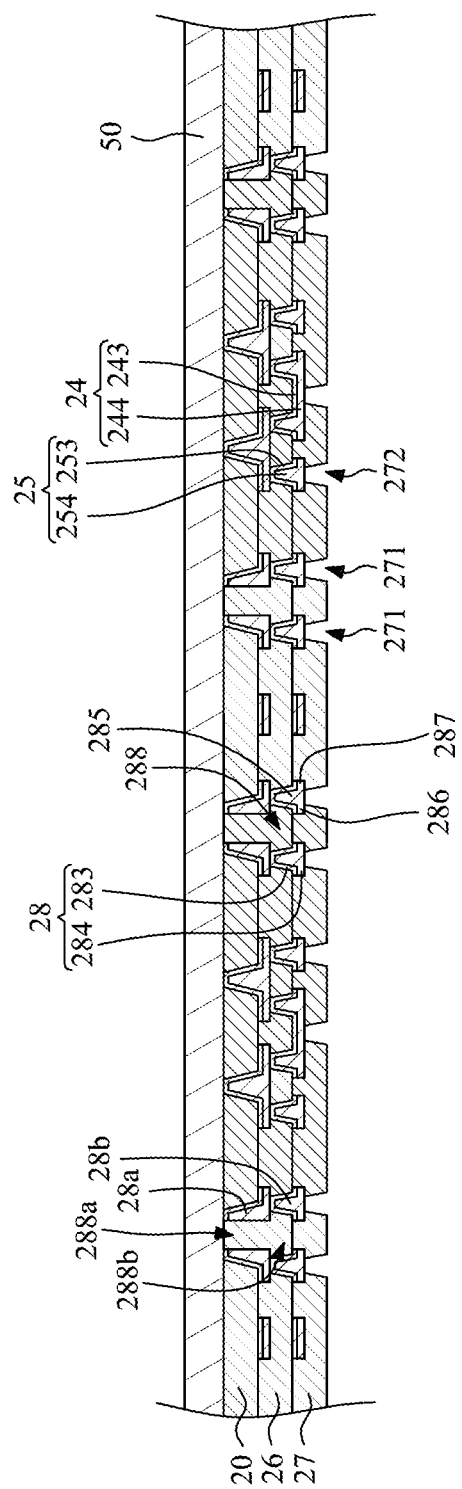
FIG. 19 illustrates one or more stages of an example of a method for manufacturing a wiring structure according to some embodiments of the present disclosure.

Referring to FIG. 19, a patterned third dielectric layer 27 is formed on the second dielectric layer 26 to cover the circuit layer 24. The patterned third dielectric layer 27 defines at least one ring groove 271 and at least one second opening 272 extending the third dielectric layer 27. The ring groove 271 is disposed on the second dam portion 28b so as to expose a portion of the second dam portion 28b. The second opening 272 is disposed on the circuit layer 24 so as to expose a portion of the circuit layer 24.

Figure 20:
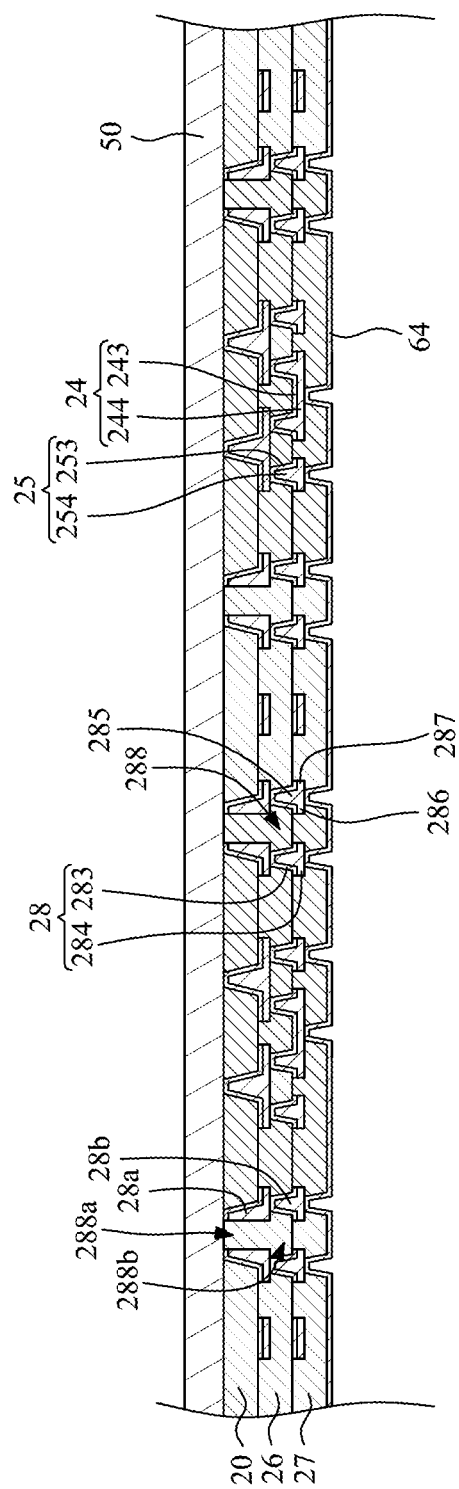
FIG. 20 illustrates one or more stages of an example of a method for manufacturing a wiring structure according to some embodiments of the present disclosure.

Referring to FIG. 20, a seed layer 64 is formed or disposed on the third dielectric layer 27, the ring groove 271 and the second opening 272 by a physical vapor deposition (PVD) technique or other suitable techniques.

Figure 21:
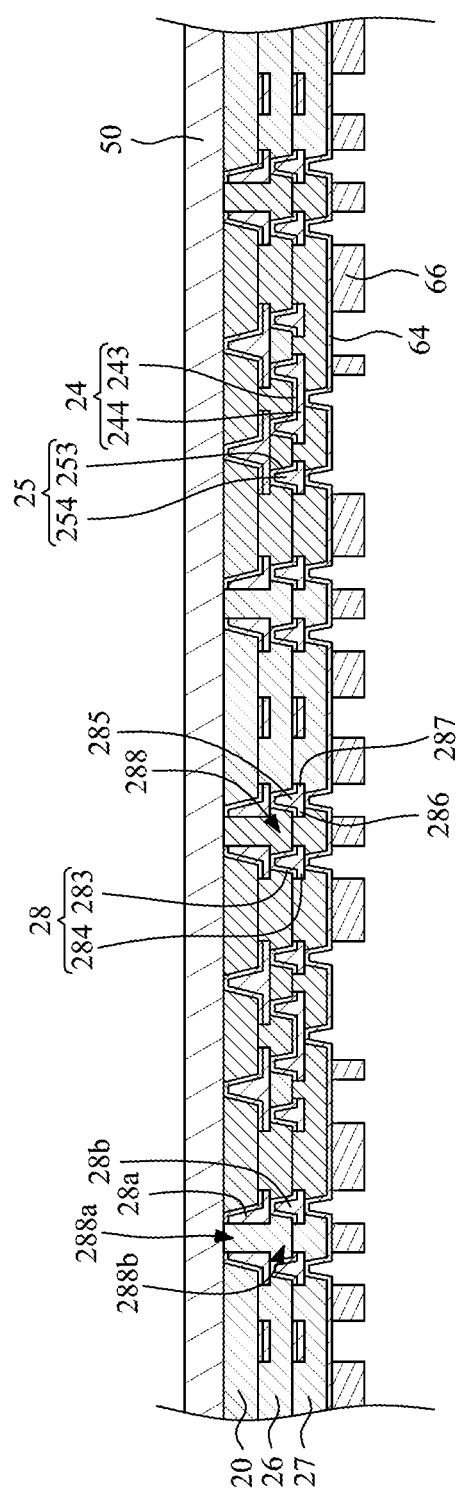
FIG. 21 illustrates one or more stages of an example of a method for manufacturing a wiring structure according to some embodiments of the present disclosure.

Referring to FIG. 21, a third photoresist layer 66 is formed or disposed on the seed layer 64. Then, the third photoresist layer 60 is patterned to form a plurality of openings to expose portions of the seed layer 64 by an exposure and development technique or other suitable techniques.

Figure 22:
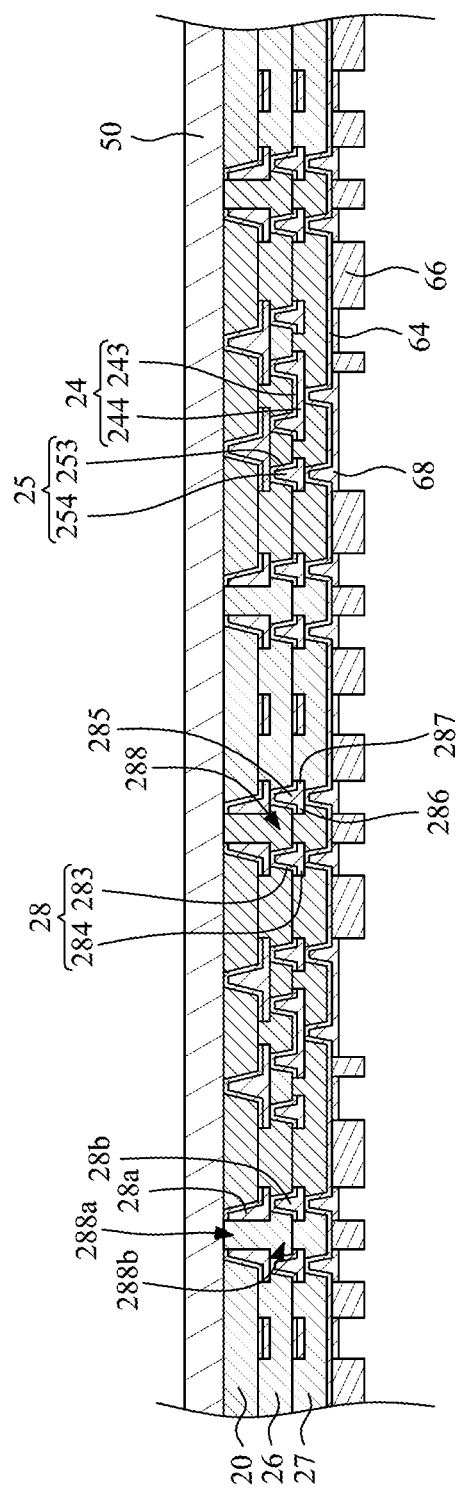
FIG. 22 illustrates one or more stages of an example of a method for manufacturing a wiring structure according to some embodiments of the present disclosure.

Referring to FIG. 22, a conductive material 68 (e.g., a metallic material) is disposed in the openings of the third photoresist layer 66 and on the seed layer 64 by a plating technique or other suitable techniques.

Figure 23:
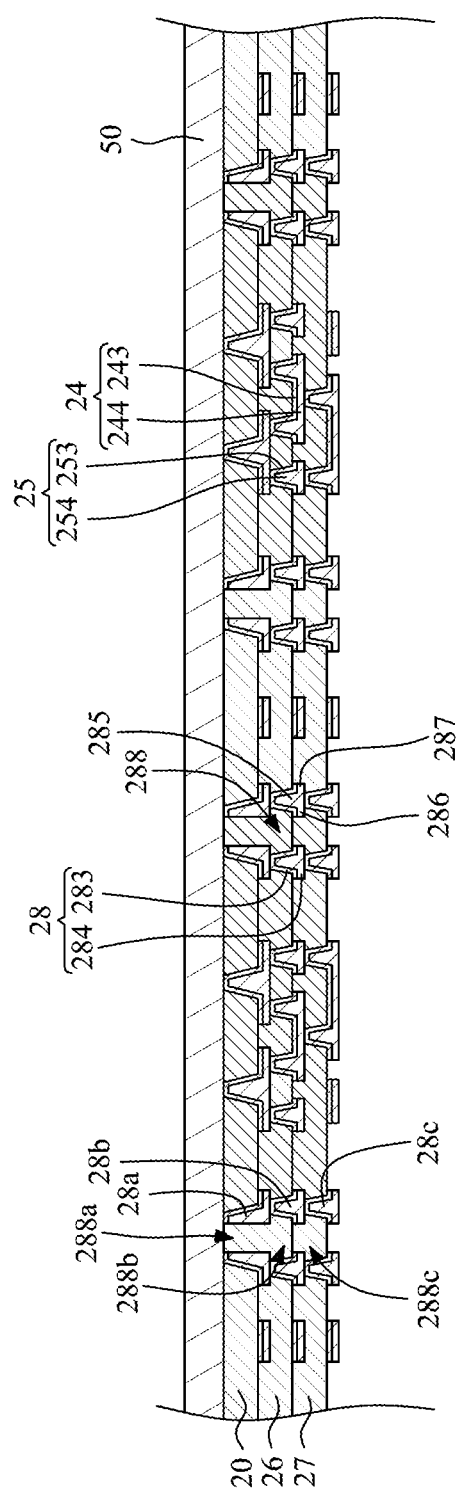
FIG. 23 illustrates one or more stages of an example of a method for manufacturing a wiring structure according to some embodiments of the present disclosure.

Referring to FIG. 23, the third photoresist layer 66 is removed by a stripping technique or other suitable techniques. Then, portions of the seed layer 64 that are not covered by the conductive material 68 are removed by an etching technique or other suitable techniques. Meanwhile, a circuit layer 24, at least one inner conductive via 25 and at least one dam portion 28 (e.g., a third dam portion 28c) are formed. The third dam portion 28c may be similar to and contact the second dam portion 28b, and may define a through hole 288c.

Figure 24:
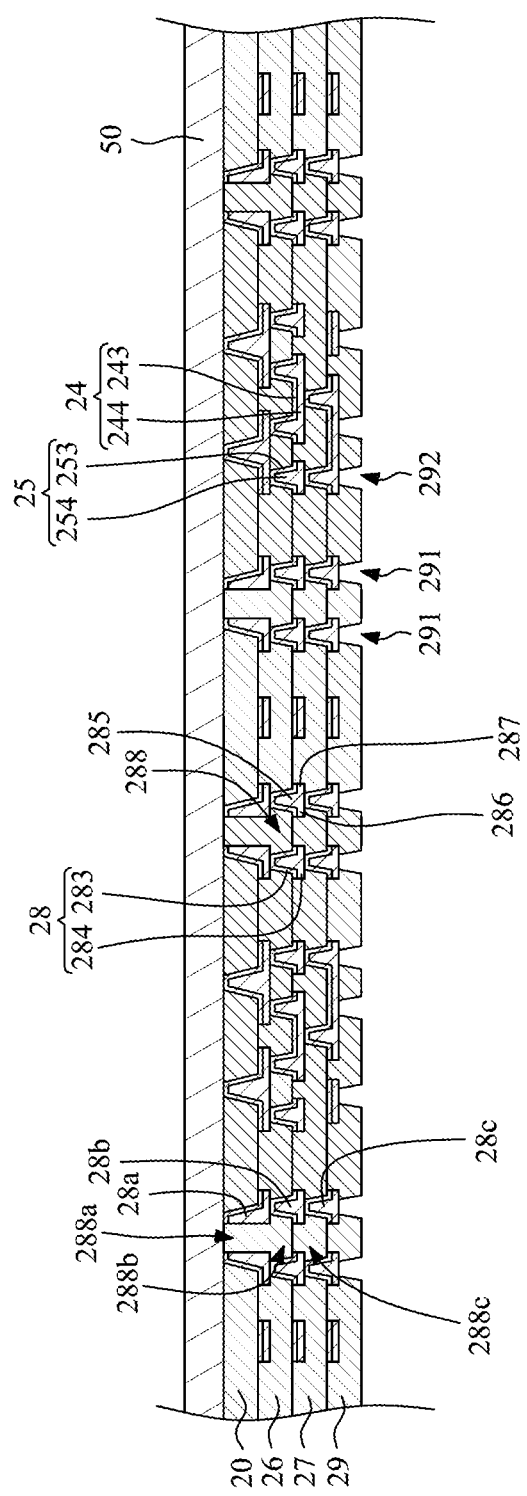
FIG. 24 illustrates one or more stages of an example of a method for manufacturing a wiring structure according to some embodiments of the present disclosure.

Referring to FIG. 24, a patterned fourth dielectric layer 29 is formed on the third dielectric layer 27 to cover the circuit layer 24. The patterned fourth dielectric layer 29 defines at least one ring groove 291 and at least one second opening 292 extending the fourth dielectric layer 29. The ring groove 291 is disposed on the third dam portion 28c so as to expose a portion of the third dam portion 28c. The second opening 292 is disposed on the circuit layer 24 so as to expose a portion of the circuit layer 24.

Figure 25:
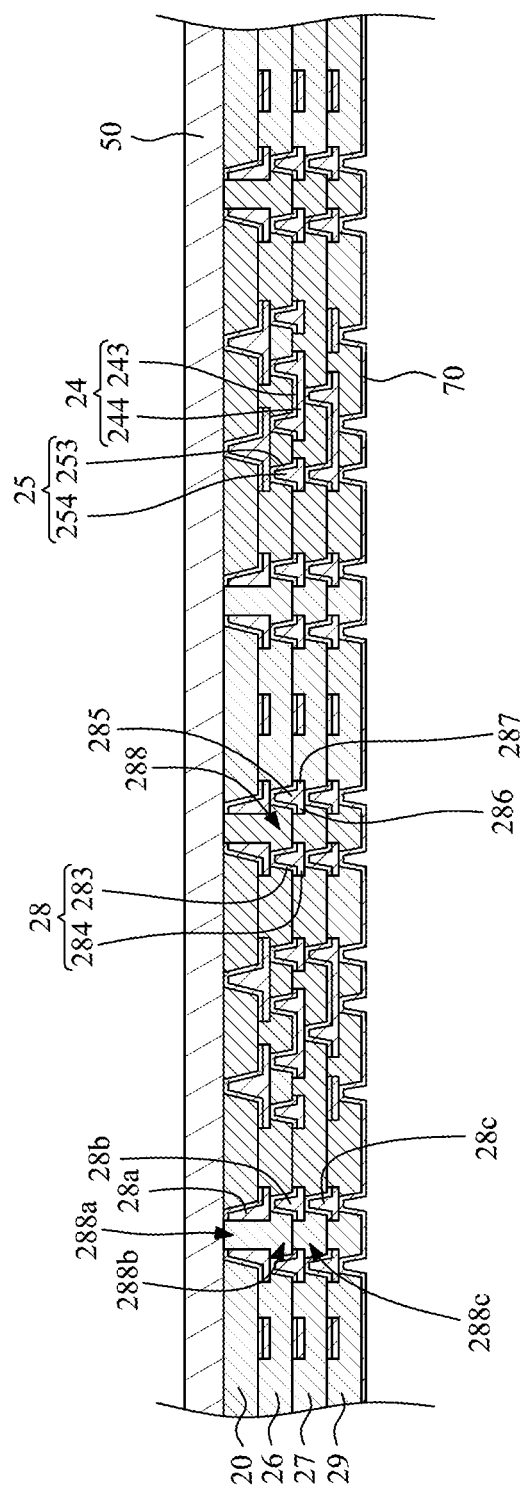
FIG. 25 illustrates one or more stages of an example of a method for manufacturing a wiring structure according to some embodiments of the present disclosure.

Referring to FIG. 25, a seed layer 70 is formed or disposed on the fourth dielectric layer 29, the ring groove 291 and the second opening 292 by a physical vapor deposition (PVD) technique or other suitable techniques.

Figure 26:
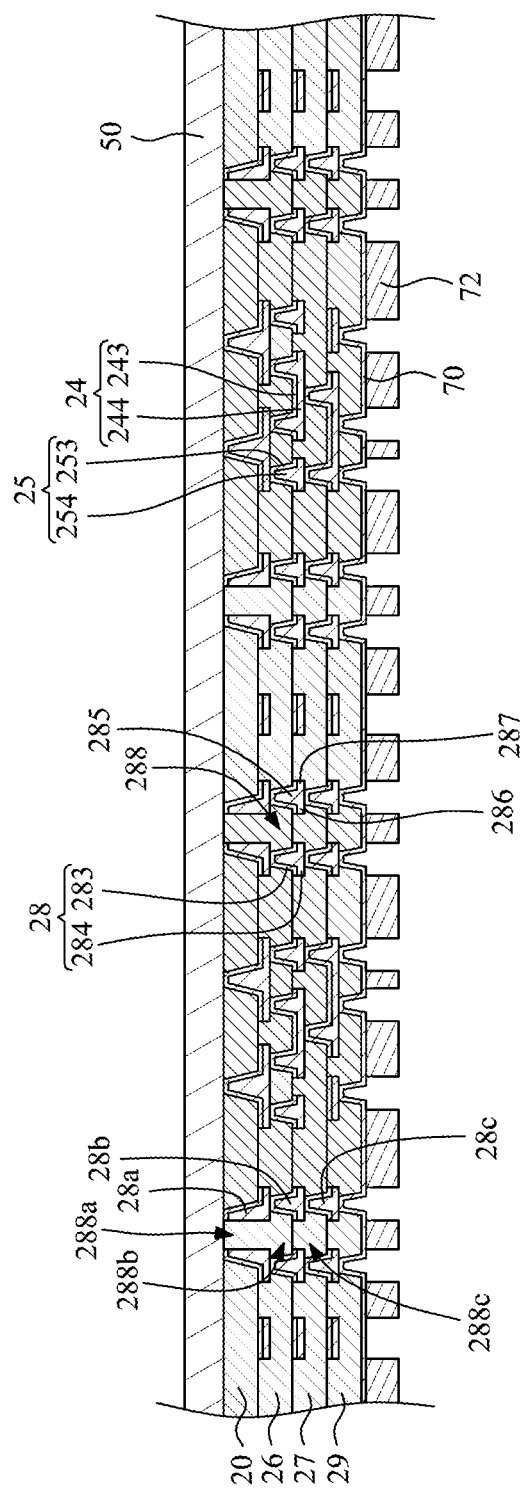
FIG. 26 illustrates one or more stages of an example of a method for manufacturing a wiring structure according to some embodiments of the present disclosure.

Referring to FIG. 26, a fourth photoresist layer 72 is formed or disposed on the seed layer 70. Then, the fourth photoresist layer 72 is patterned to form a plurality of openings to expose portions of the seed layer 70 by an exposure and development technique or other suitable techniques.

Figure 27:
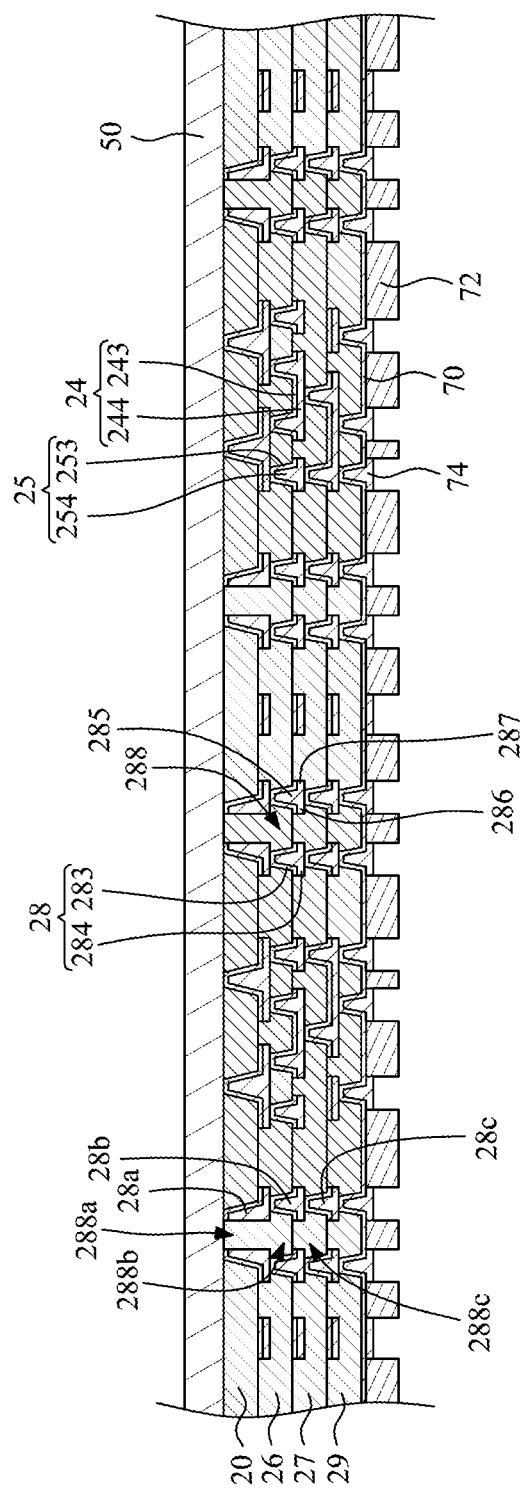
FIG. 27 illustrates one or more stages of an example of a method for manufacturing a wiring structure according to some embodiments of the present disclosure.

Referring to FIG. 27, a conductive material 74 (e.g., a metallic material) is disposed in the openings of the fourth photoresist layer 72 and on the seed layer 70 by a plating technique or other suitable techniques.

Figure 28:
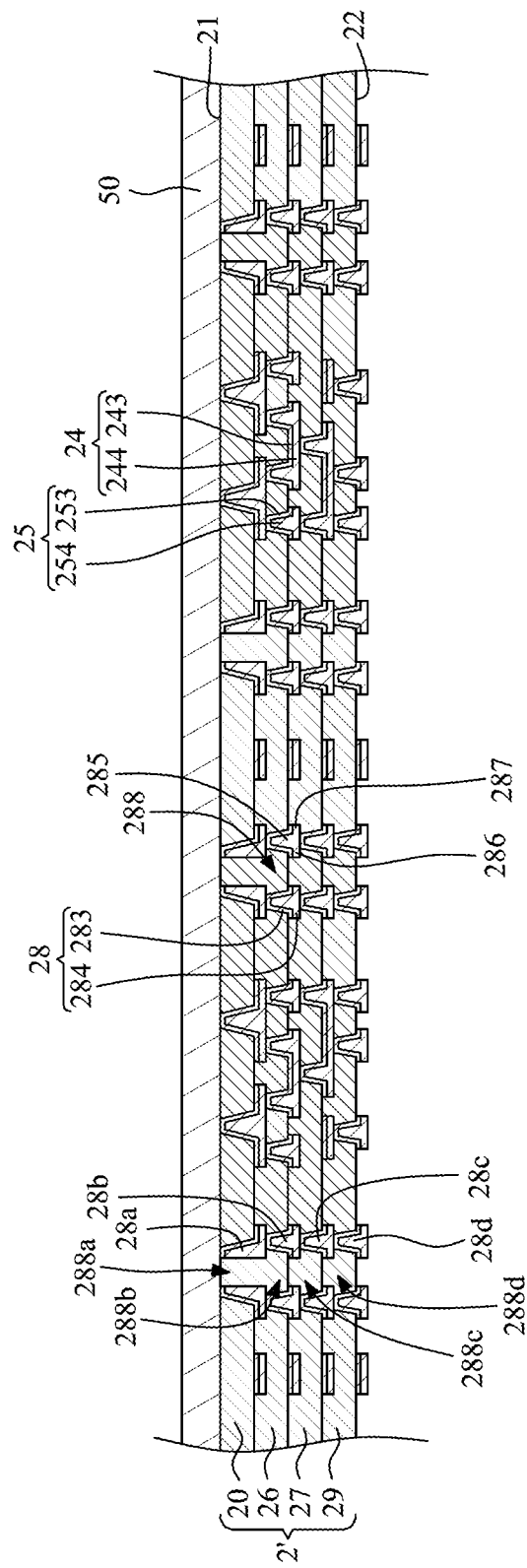
FIG. 28 illustrates one or more stages of an example of a method for manufacturing a wiring structure according to some embodiments of the present disclosure.
Figure 29:
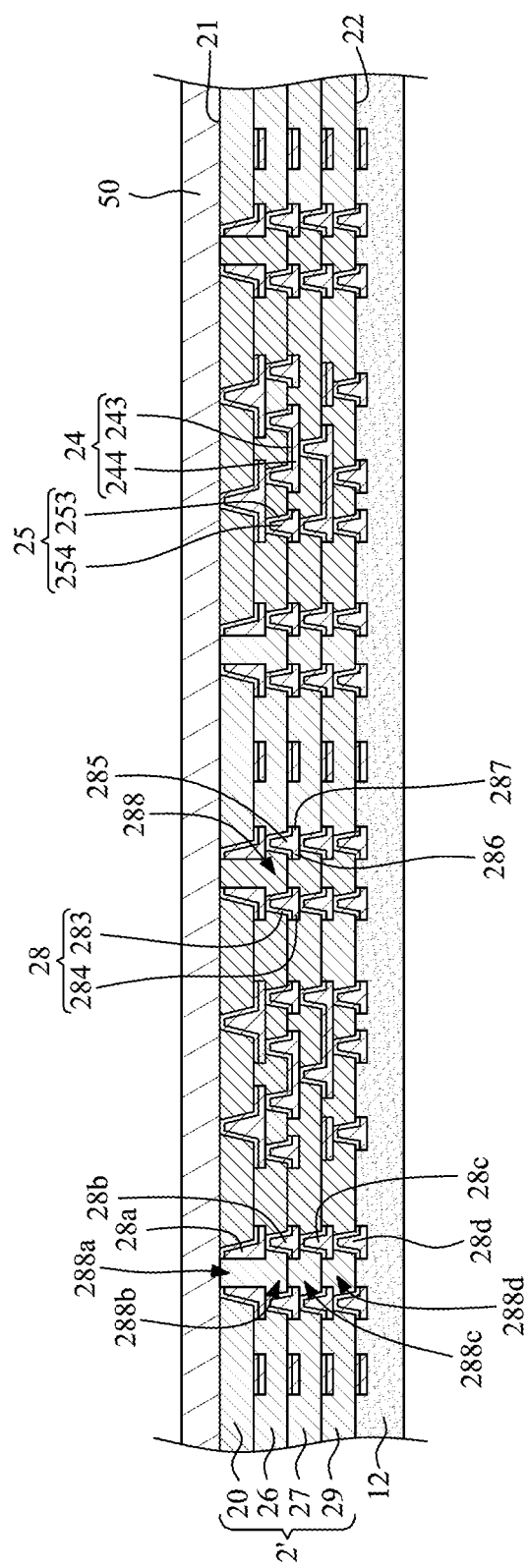
FIG. 29 illustrates one or more stages of an example of a method for manufacturing wiring structure according to some embodiments of the present disclosure.

Referring to FIG. 28, the fourth photoresist layer 72 is removed by a stripping technique or other suitable techniques. Then, portions of the seed layer 70 that are not covered by the conductive material 74 are removed by an etching technique or other suitable techniques. Meanwhile, a circuit layer 24, at least one inner conductive via 25 and at least one dam portion 28 (e.g., a fourth dam portion 28d) are formed. The fourth dam portion 28d may be similar to and contact the third dam portion 28c, and may define a through hole 288d.

Meanwhile, an upper conductive structure 2' is formed on the carrier 50. The upper conductive structure 2' may be tested, Referring to FIG. 29, an adhesive layer 12 is formed or applied on the upper conductive structure 2'.

Figure 30:
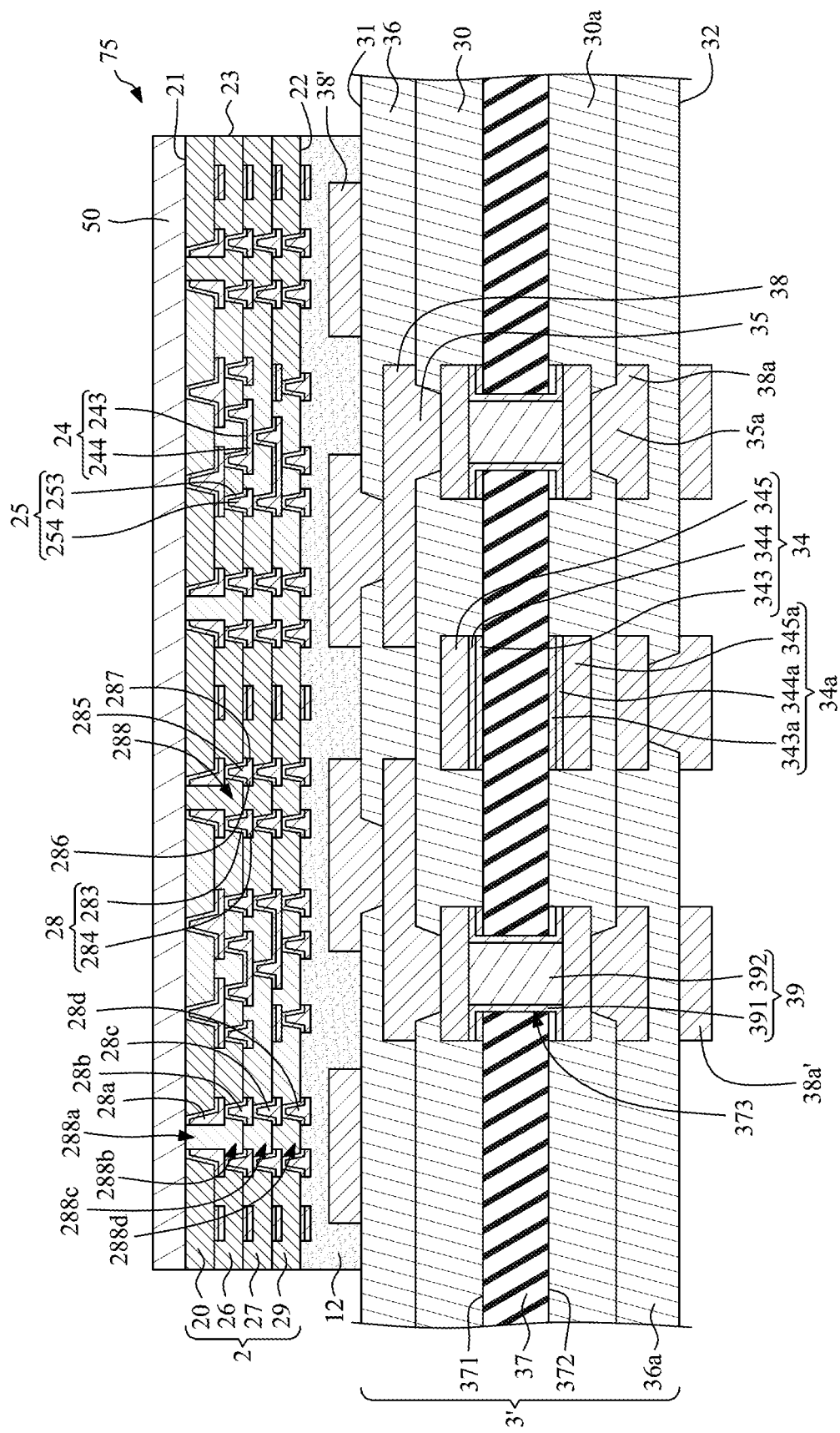
FIG. 30 illustrates one or more stages of an example of a method for manufacturing a wiring structure according to some embodiments of the present disclosure.

Referring to FIG. 30, the upper conductive structure 2', the carrier 50 and the adhesive layer 12 are cut to form a plurality of unit structures 75. The unit structure 75 includes an upper conductive structure 2, a portion of the carrier 50 and an adhesive layer 12. The upper conductive structure 2 of FIG. 29 may be the upper conductive structure 2 of FIG. 1. Then, the unit structure 75 is attached to the lower conductive structure 3' of FIG. 8. The upper conductive structure 2 faces the lower conductive structure 3'. Thus, the upper conductive structure 2 and the carrier 50 are attached to the lower conductive structure 3' through the adhesive layer 12. Then, the adhesive layer 12 is cured to form an intermediate layer 12.

Figure 31:
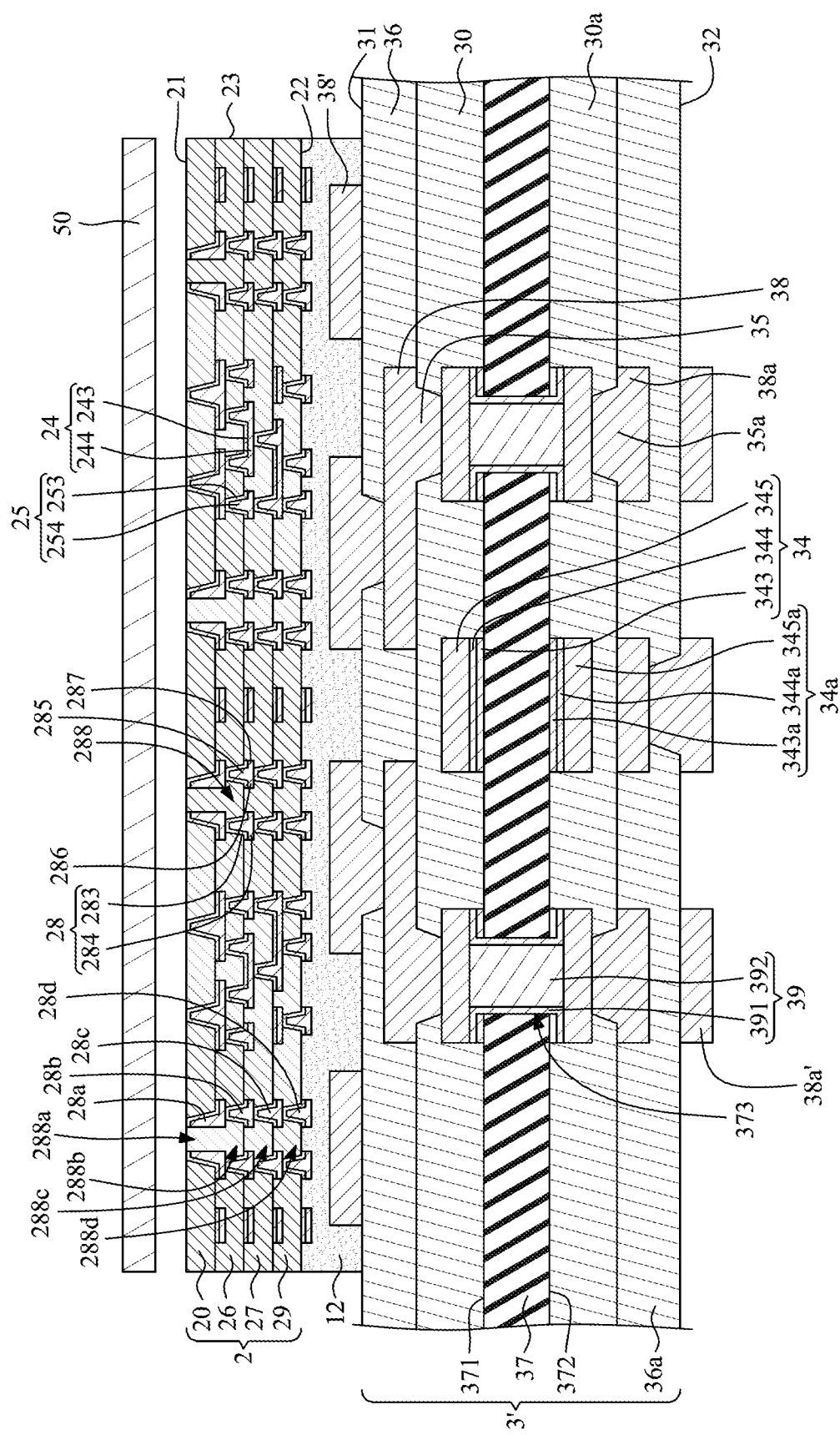
FIG. 31 illustrates one or more stages of an example of a method for manufacturing a wiring structure according to some embodiments of the present disclosure.

Referring to FIG. 31, the carrier 50 is removed.

Figure 32:
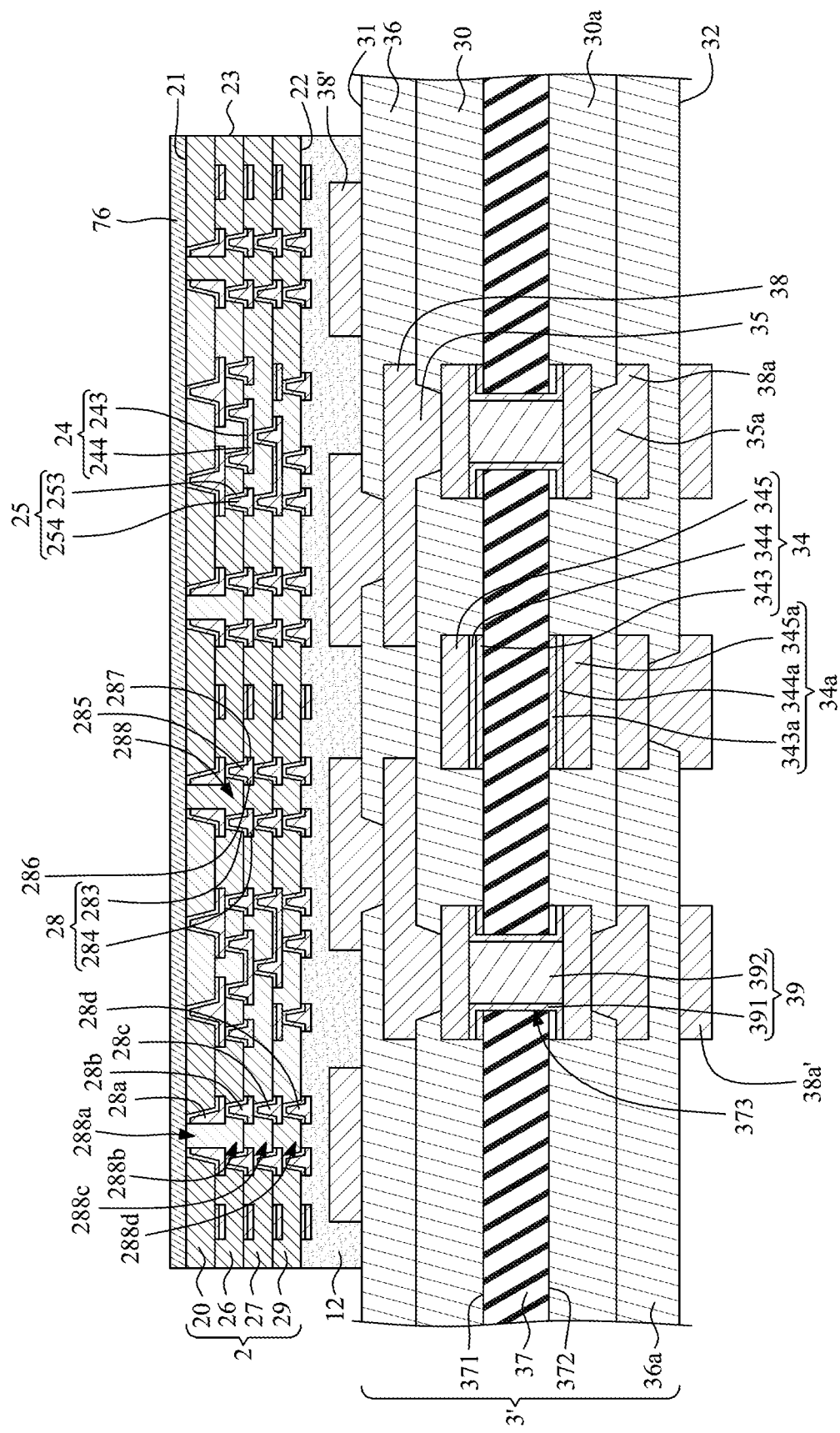
FIG. 32 illustrates one or more stages of an example of a method for manufacturing a wiring structure according to some embodiments of the present disclosure.

Referring to FIG. 32, a mask layer 76 (e.g., a metal hard mask) is formed or disposed on a top surface 21 of the upper conductive structure 2.

Figure 33:
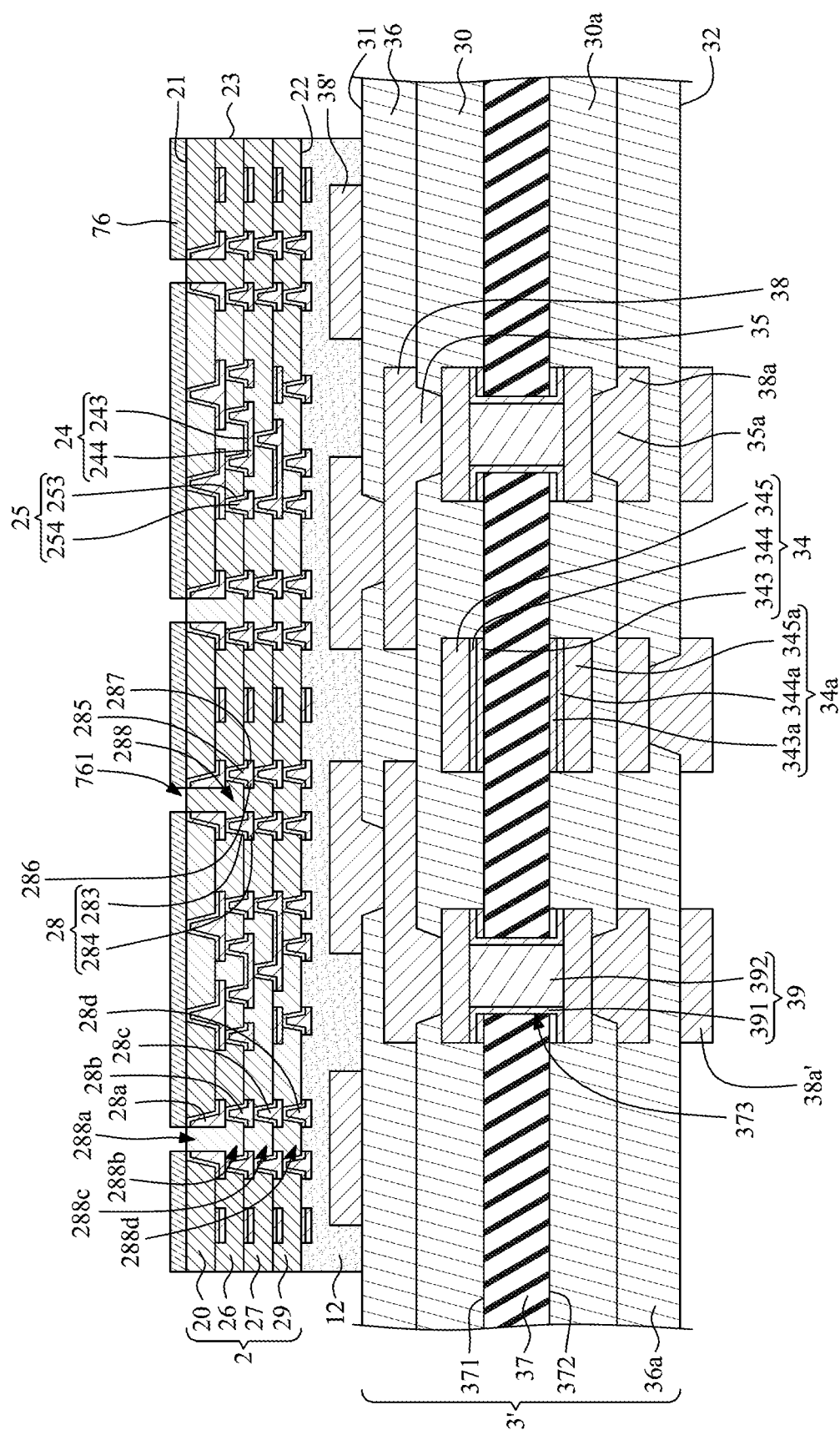
FIG. 33 illustrates one or more stages of an example of a method for manufacturing a wiring structure according to some embodiments of the present disclosure.

Referring to FIG. 33, the mask layer 76 is patterned to form a plurality of openings 761 to expose the first dam portions 28a.

Figure 34:
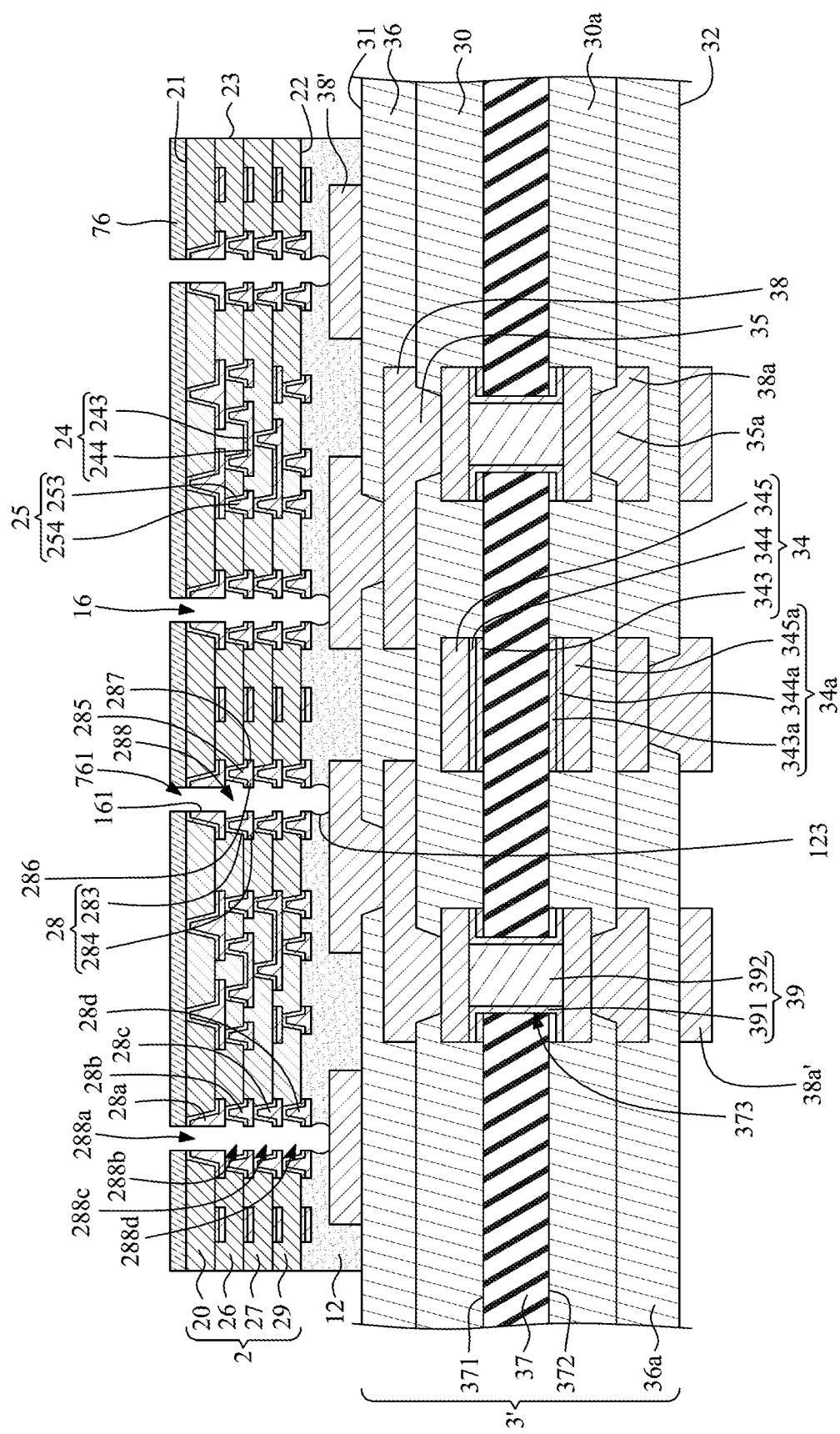
FIG. 34 illustrates one or more stages of an example of a method for manufacturing a wiring structure according to some embodiments of the present disclosure.

Referring to FIG. 34, portions of the dielectric layers (e.g., the first dielectric layer 20, the second dielectric layer 26, the third dielectric layer 27 and the fourth dielectric layer 29) in the through holes 288a, 288b, 288c, 288d of the dam portions 28 (e.g., the first dam portion 28a, the second dam portion 28b, the third dam portion 28c and the fourth dam portion 28d) and a portion of the intermediate layer 12 are removed to form an accommodating hole 16 through plasma etching. Thus, a portion of the topmost circuit layer (e.g., the top surface of the second upper circuit layer 38') of the lower conductive structure 3' is exposed.

Figure 35:
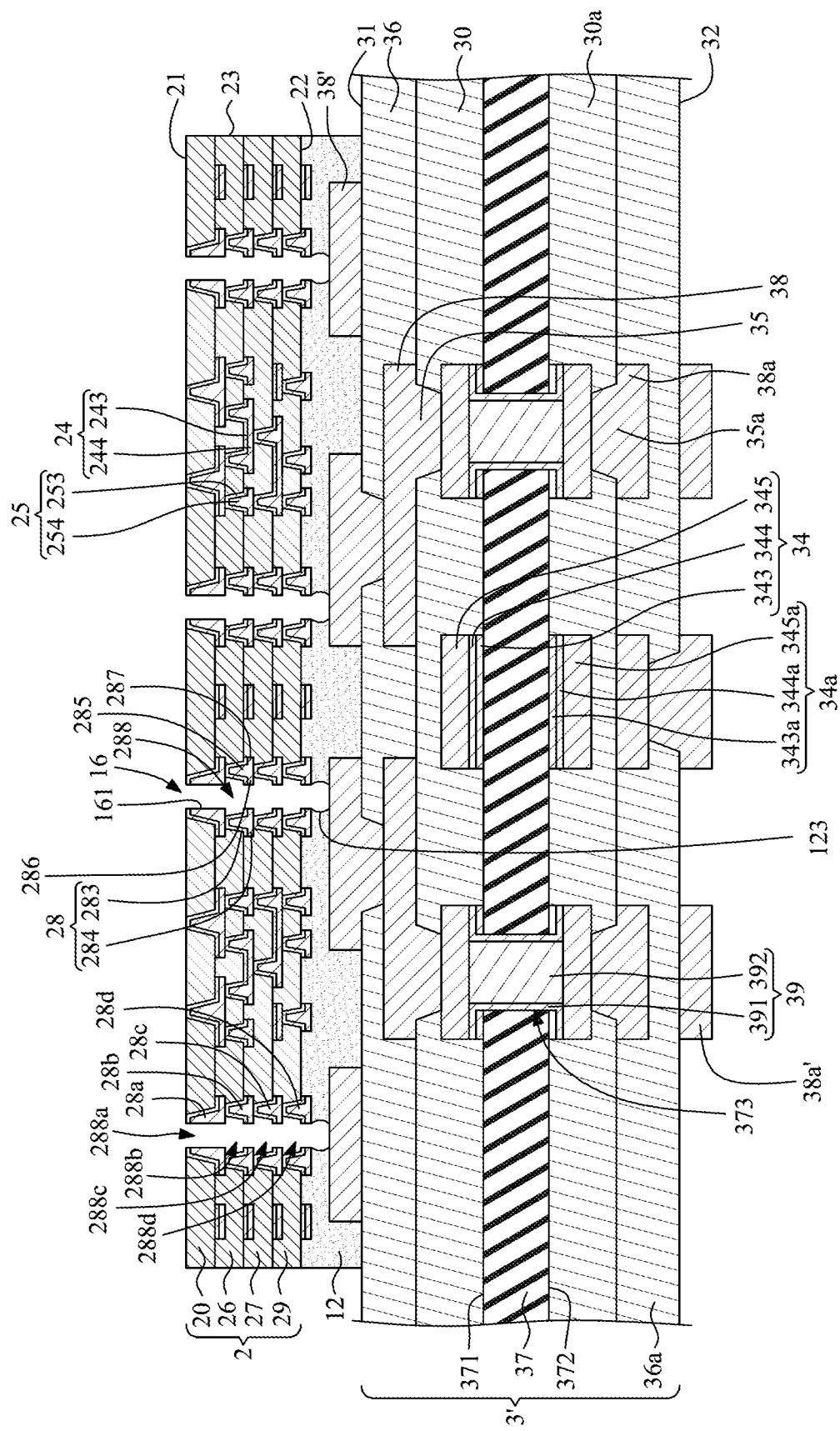
FIG. 35 illustrates one or more stages of an example of a method for manufacturing a wiring structure according to some embodiments of the present disclosure.

Referring to FIG. 35, the mask layer 76 is removed.

Figure 36:
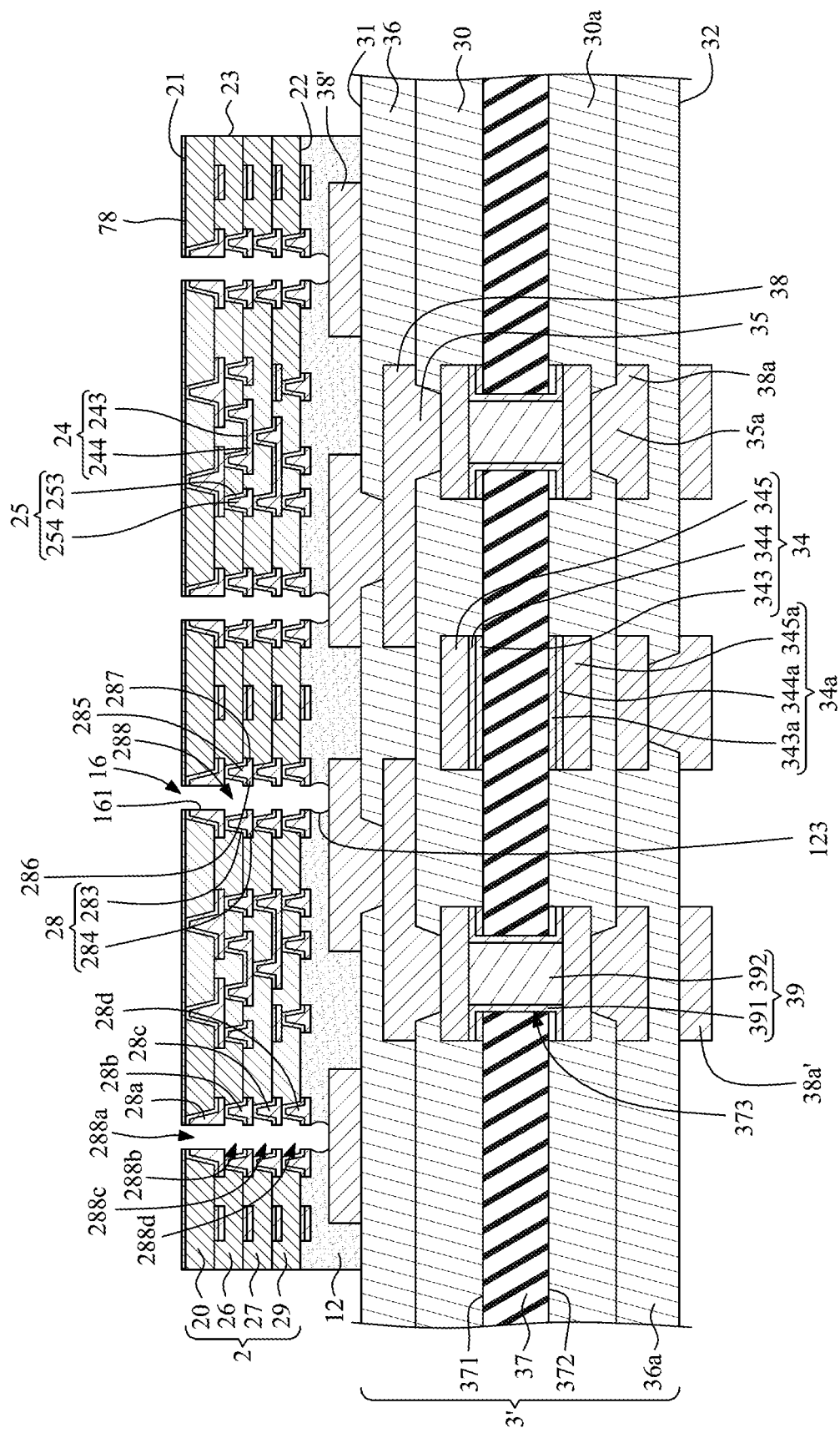
FIG. 36 illustrates one or more stages of an example of a method for manufacturing a wiring structure according to some embodiments of the present disclosure.

Referring to FIG. 36, a seed layer 78 is formed or disposed on the top surface 21 of the upper conductive structure 2. The seed layer 78 may or may not extend into the accommodating hole 16.

Figure 37:
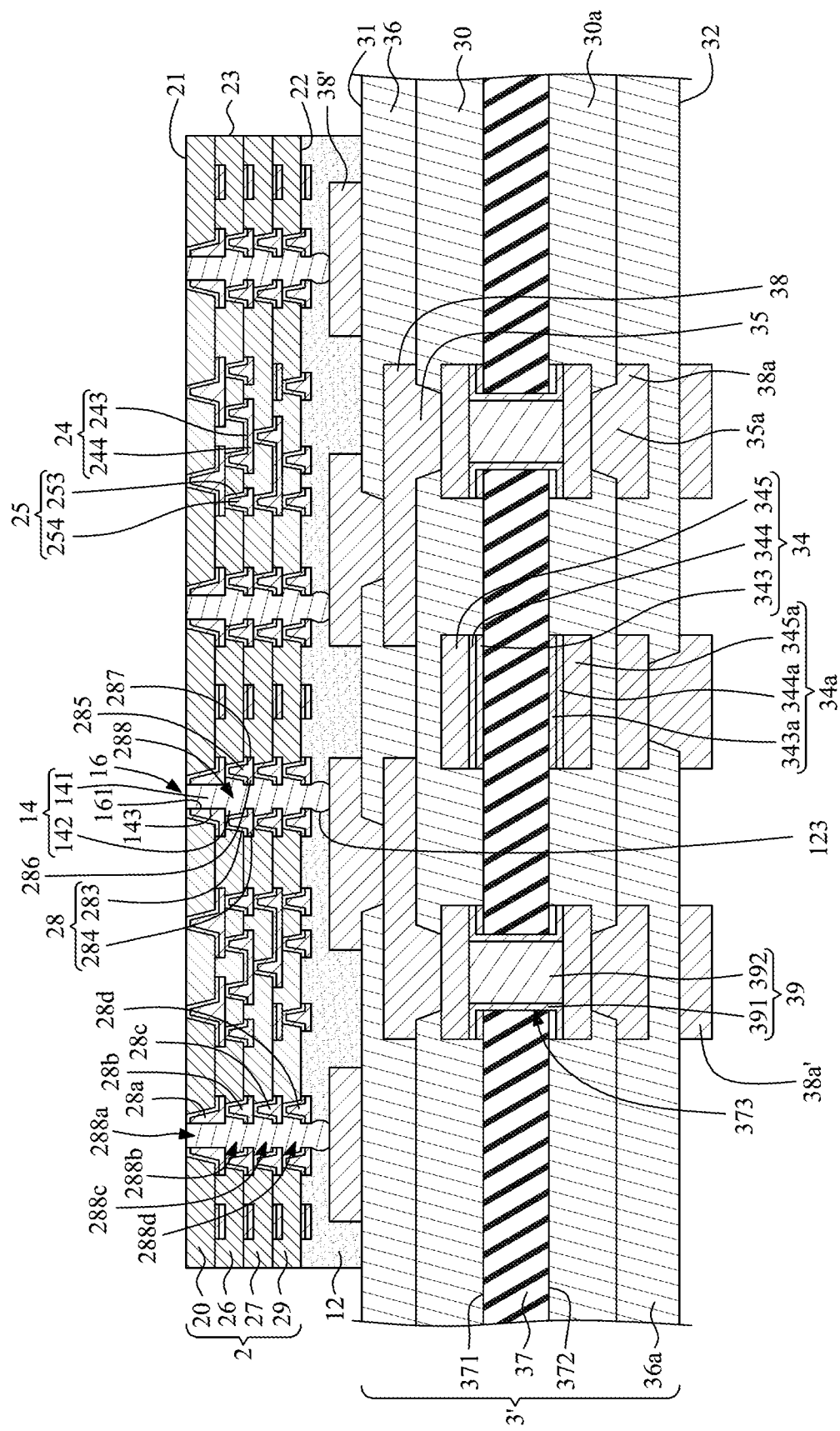
FIG. 37 illustrates one or more stages of an example of a method for manufacturing a wiring structure according to some embodiments of the present disclosure.

Referring to FIG. 37, a conductive material (e.g., a metallic material) is formed or disposed to fill the accommodating hole 16 through, for example, plating, so as to form a conductive through via 14 in the accommodating hole 16. The conductive through via 14 extends through the dam portions 28 (e.g., the first dam portion 28a, the second dam portion 28b, the third dam portion 28c and the fourth dam portion 28d), and contacts a portion of the topmost circuit layer (e.g., the top surface of the second upper circuit layer 38') of the lower conductive structure 3'.

Then, the lower conductive structure 3' is singulated so as to obtain the wiring structure 1 of FIG. 1.

Since a width and a profile of the accommodating hole 16 are defined and limited by the solid portions of the dam portions 28. As a result, a width of the accommodating hole 16 may be relatively small, and the accommodating hole 16 may not have a barrel shape. Accordingly, the width of the conductive through via 14 may be relatively small, and the conductive through via 14 may not have a barrel shape.

Figure 38:
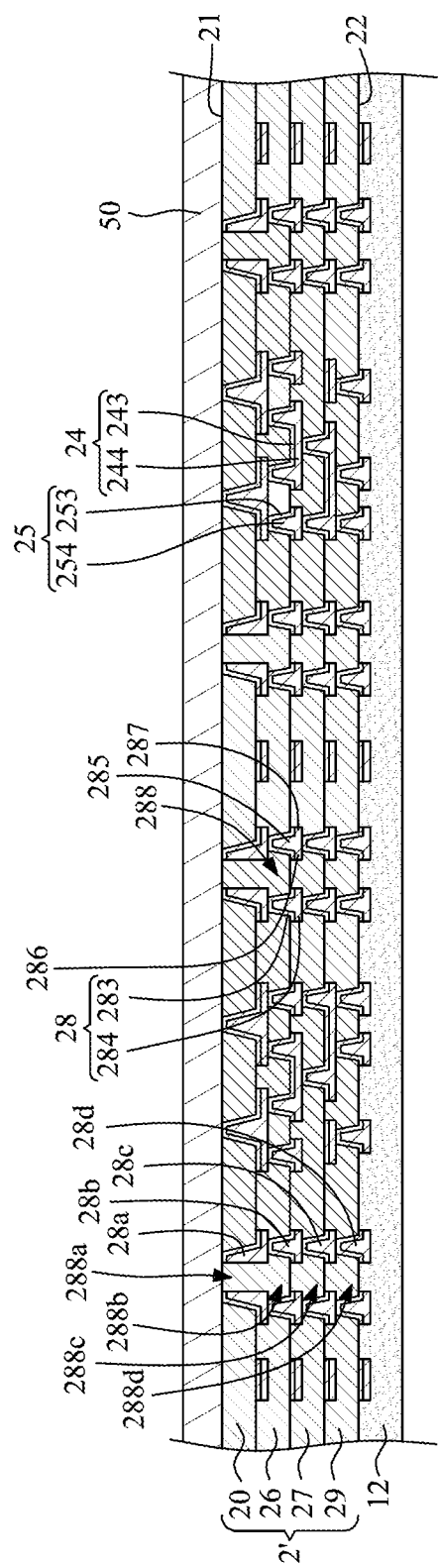
FIG. 38 illustrates one or more stages of an example of a method for manufacturing a wiring structure according to some embodiments of the present disclosure.

FIG. 38 through FIG. 43 illustrate a method for manufacturing a wiring structure according to some embodiments of the present disclosure. In some embodiments, the method is for manufacturing the wiring structure 1 shown in FIG. 1. The initial stages of the illustrated process are the same as, or similar to, the stages illustrated in FIG. 8 to FIG. 28. FIG. 38 depicts a stage subsequent to that depicted in FIG. 28.

Referring to FIG. 38, an adhesive layer 12 is formed or applied on the upper conductive structure 2'.

Figure 39:
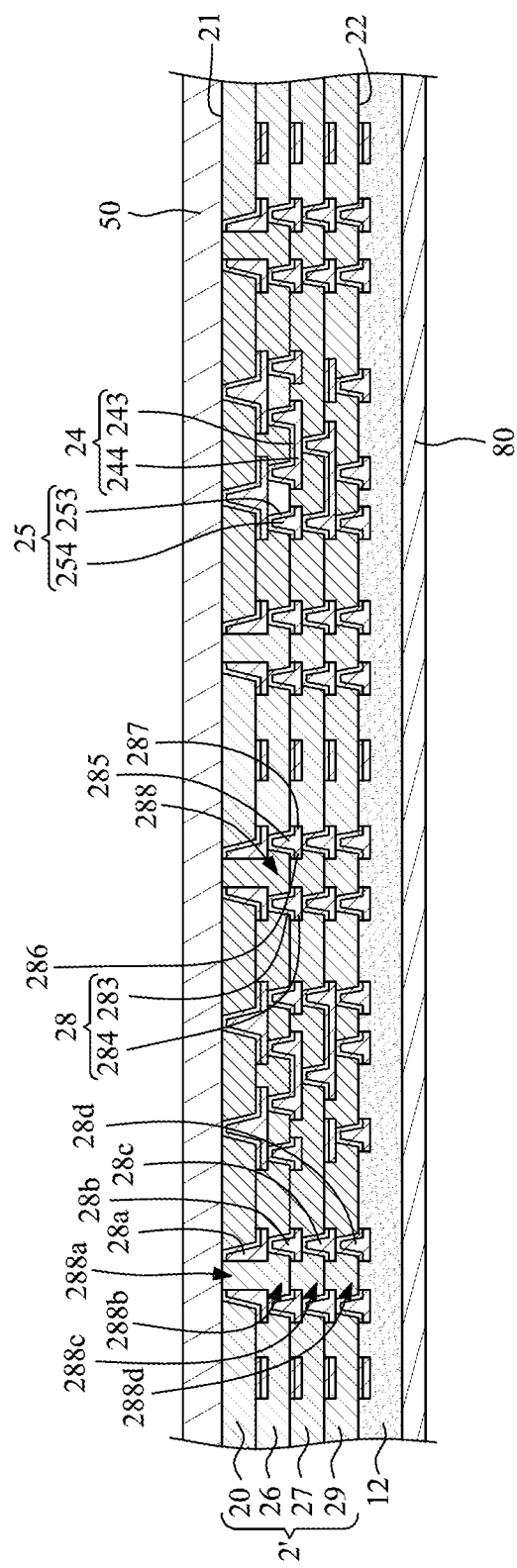
FIG. 39 illustrates one or more stages of an example of a method for manufacturing a wiring structure according to some embodiments of the present disclosure.

Referring to FIG. 39, a mask layer 80 (e.g., a metal hard mask) is formed or disposed on a top surface 21 of the upper conductive structure 2.

Figure 40:
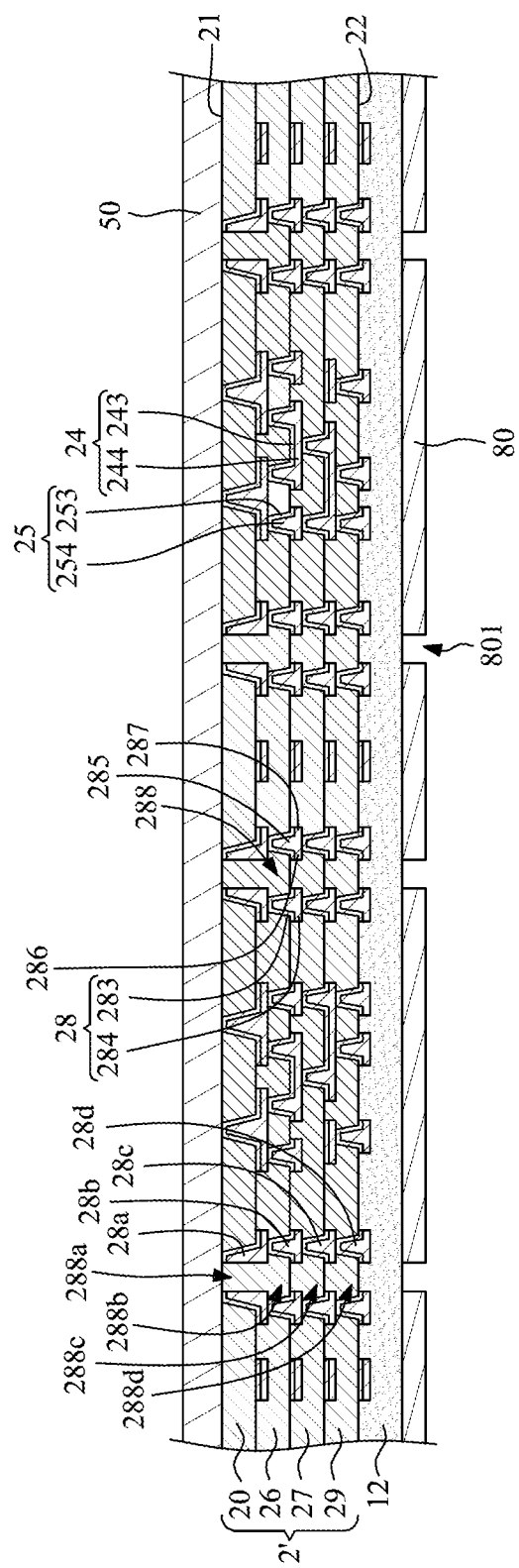
FIG. 40 illustrates one or more stages of an example of a method for manufacturing wiring structure according to some embodiments of the present disclosure.

Referring to FIG. 40, the mask layer 80 is patterned to form a plurality of openings 801 corresponding to the fourth dam portions 28d.

Figure 41:
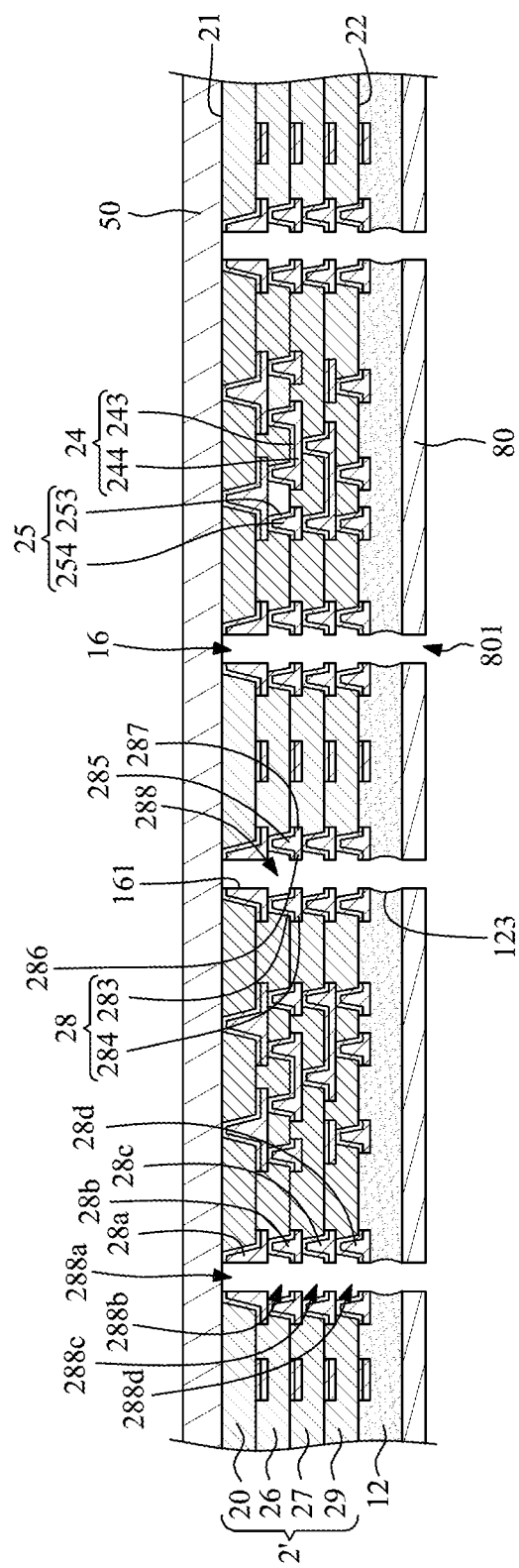
FIG. 41 illustrates one or more stages of an example of a method for manufacturing a wiring structure according to some embodiments of the present disclosure.

Referring to FIG. 41, portions of the dielectric layers (e.g., the first dielectric layer 20, the second dielectric layer 26, the third dielectric layer 27 and the fourth dielectric layer 29) in the through holes 288a, 288b, 288c, 288d of the dam portions 28 (e.g., the first dam portion 28a, the second dam portion 28b, the third dam portion 28c and the fourth dam portion 28d) and a portion of the intermediate layer 12 are removed to form an accommodating hole 16 through plasma etching. Thus, a portion of the carrier 50 is exposed.

Figure 42:
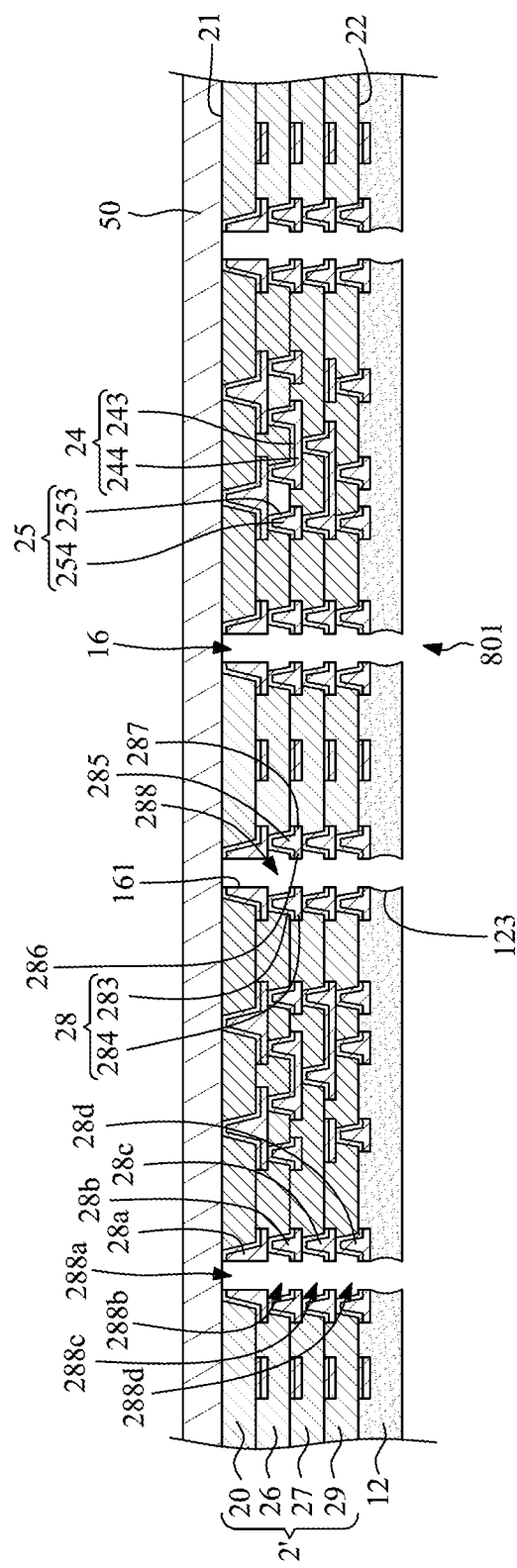
FIG. 42 illustrates one or more stages of an example of a method for manufacturing a wiring structure according to some embodiments of the present disclosure.

Referring to FIG. 42, the mask layer 80 is removed.

Figure 43:
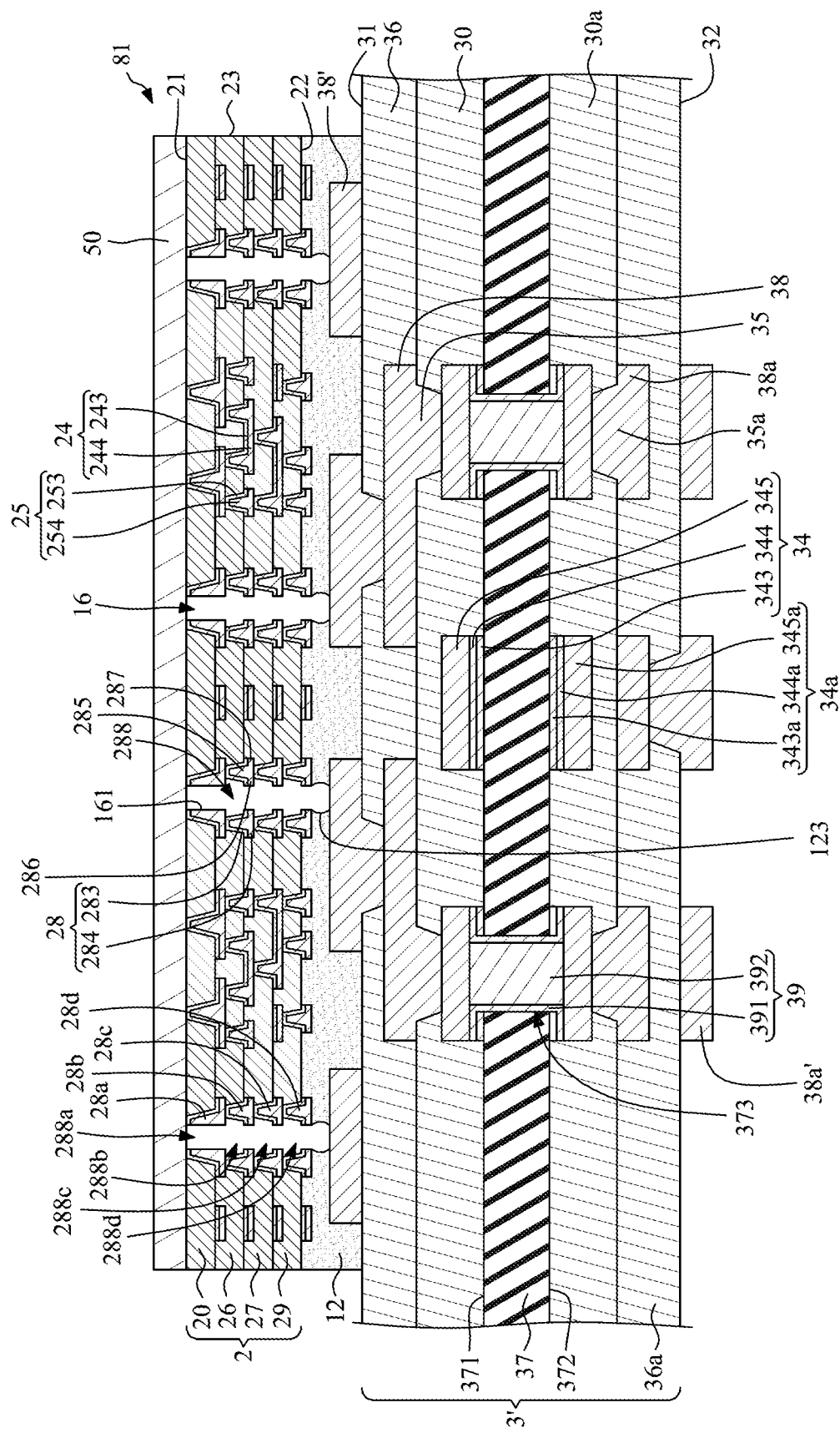
FIG. 43 illustrates one or more stages of an example of a method for manufacturing a wiring structure according to some embodiments of the present disclosure.

Referring to FIG. 43, the upper conductive structure 2', the carrier 50 and the adhesive layer 12 are cut to form a plurality of unit structures 81. The unit structure 81 includes an upper conductive structure 2, a portion of the carrier 50 and an adhesive layer 12. The upper conductive structure 2 of FIG. 43 may be the upper conductive structure 2 of FIG. 1.

Then, the unit structure 81 is attached to the lower conductive structure 3' of FIG. 8. The upper conductive structure 2 faces the lower conductive structure 3'. Thus, the upper conductive structure 2 and the carrier 50 are attached to the lower conductive structure 3' through the adhesive layer 12. Then, the adhesive layer 12 is cured to form an intermediate layer 12. Meanwhile, a portion of the topmost circuit layer (e.g., the top surface of the second upper circuit layer 38') of the lower conductive structure 3' is exposed in the accommodating hole 16.

Then, the following stages of the illustrated process are the same as, or similar to, the stage illustrated in FIG. 35 to FIG. 37, so as to obtain the wiring structure 1 of FIG. 1. For example, the carrier 50 is removed as shown in FIG. 35. The conductive through via 14 is formed as shown in FIG. 37. Then, the lower conductive structure 3' is singulated.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
a conductive structure including a plurality of dielectric layers, a plurality of circuit layers in contact with the dielectric layers, and a plurality of dam portions in contact with the dielectric layers, wherein the dam portions are stacked on and contact one another; and
at least one conductive through via extending through the dam portions;
wherein each of the dam portions includes a main portion and an extending portion, the main portion extends through a dielectric layers, the extending portion is disposed on a surface of the dielectric layer, and a width of the main portion gradually increases toward the extending portion.

2. The wiring structure of claim 1, wherein the dam portions and the circuit layers are formed concurrently.

3. The wiring structure of claim 1, wherein each of the dam portions defines a through hole, and the at least one conductive through via is disposed in the through holes of the dam portions.

4. The wiring structure of claim 1, wherein each of the dam portions is in a substantially closed ring shape.

5. The wiring structure of claim 1, wherein each of the dam portions defines a through hole, and the extending portion includes an inner extending portion extending inwardly toward the through hole, and an outer extending portion extending opposite to the inner extending portion.

6. The wiring structure of claim 1, wherein each of the dam portions includes a seed layer and a conductive material disposed on the seed layer, and the seed layer is disposed between the conductive material and the at least one conductive through via, wherein the main portion of each of the dam portions includes a first portion of the conductive material and a first portion of the seed layer disposed on a sidewall and a bottom surface of the first portion of the conductive material, the extending portion of each of the dam portions includes a second portion of the conductive material and a second portion of the seed layer disposed on a bottom surface of the second portion of the conductive material.

7. The wiring structure of claim 1, wherein the stacked dam portions define an accommodating hole, an inner surface of the accommodating hole is not a continuous surface, and the conductive through via fills the accommodating hole.

8. The wiring structure of claim 1, wherein a maximum width of the dam portions is less than or equal to 20 µm.

9. The wiring structure of claim 1, wherein each of the dam portions defines a through hole, each of the through holes has a width, and the widths of the through holes gradually decreases from a bottommost dam portion to a topmost dam portion.

10. The wiring structure of claim 1, wherein the conductive structure further includes at least one inner conductive via disposed between two adjacent ones of the circuit layers for electrically connecting the two adjacent ones of the circuit layers, a tapering direction of the inner conductive via is same as a tapering direction of the dam portion.

11. The wiring structure of claim 1, wherein a top portion of the conductive through via covers a top surface of the conductive structure, and the wiring structure further comprises a seed layer interposed between the top portion of the conductive through via and the top surface of the conductive structure.

12. The wiring structure of claim 1, wherein each of the dam portions includes a seed layer and a conductive material disposed on the seed layer, the conductive through via includes a conductive material, the conductive material of the conductive through via is different from the conductive material of the dam portion, and the seed layer is located between the conductive through via and at least one of the dam portions.

13. The wiring structure of claim 12, wherein a grain size of the conductive material of the conductive through via is greater than a grain size of the conductive material of the dam portion.

14. The wiring structure of claim 1, wherein the dielectric layers contact one another.

15. A wiring structure, comprising:
- a lower conductive structure including at least one dielectric layer and at least one circuit layer in contact with the dielectric layer;
- an upper conductive structure disposed on the lower conductive structure, wherein the upper conductive structure includes a plurality of dielectric layers, a plurality of circuit layers in contact with the dielectric layers, and a plurality of dam portions in contact with the dielectric layers, wherein the dam portions are stacked on and contact one another;
- at least one conductive through via extending through the dam portions and the upper conductive structure, and terminating on the circuit layer of the lower conductive structure; and
- an intermediate layer disposed between the upper conductive structure and the lower conductive structure, wherein the conductive through via further extends through the intermediate layer, the intermediate layer defines at least one through hole, and a sidewall of the through hole of the intermediate layer curves outward toward the intermediate layer.

16. The wiring structure of claim 15, wherein a length of the conductive through via is greater than a thickness of the upper conductive structure.

17. The wiring structure of claim 15, wherein a lateral surface of the lower conductive structure is displaced from a lateral surface of the upper conductive structure.

18. The wiring structure of claim 15, wherein a line space of the circuit layer of the lower conductive structure is greater than a line space of the circuit layer of the upper conductive structure.

19. The wiring structure of claim 15, wherein a topmost circuit layer of the lower conductive structure and a bottommost circuit layer of the upper conductive structure are embedded in the intermediate layer.

20. The wiring structure of claim 15, wherein each of the dam portions includes a main portion and an extending portion, the main portion extends through a dielectric layer, the extending portion is disposed on a surface of the dielectric layer, and a width of the main portion gradually increases toward the lower conductive structure.

\* \* \* \* \*